United States Patent
Okayasu et al.

(10) Patent No.: US 7,848,828 B2
(45) Date of Patent: Dec. 7, 2010

(54) METHOD AND APPARATUS FOR MANAGING MANUFACTURING EQUIPMENT, METHOD FOR MANUFACTURING DEVICE THEREBY

(75) Inventors: Toshiyuki Okayasu, Tokyo (JP); Shigetoshi Sugawa, Miyagi (JP); Akinobu Teramoto, Miyagi (JP)

(73) Assignees: National University Corporation Tohoku University, Miyagi (JP); Advantest Corporation, Tokyo (JP)

( * ) Notice: Subject to any disclaimer, the term of this patent is extended or adjusted under 35 U.S.C. 154(b) by 298 days.

(21) Appl. No.: 12/055,310

(22) Filed: Mar. 25, 2008

(65) Prior Publication Data

US 2009/0081819 A1      Mar. 26, 2009

Related U.S. Application Data

(63) Continuation of application No. PCT/JP2005/017755, filed on Sep. 27, 2005.

(51) Int. Cl.
  *G05B 11/01* (2006.01)
  *G06F 19/00* (2006.01)
  *G01B 5/28* (2006.01)
  *H01L 23/58* (2006.01)

(52) U.S. Cl. ............... 700/21; 257/48; 700/95; 700/96; 700/108; 700/110; 700/116; 700/117; 702/35

(58) Field of Classification Search .......... 700/108, 700/110, 95, 96, 116, 117, 121; 257/48; 702/35

See application file for complete search history.

(56) References Cited

U.S. PATENT DOCUMENTS

| 4,175,317 A | * | 11/1979 | Aoki et al. ............ 438/193 |
|---|---|---|---|
| 4,631,686 A | * | 12/1986 | Ikawa et al. ............ 716/12 |
| 4,766,395 A | * | 8/1988 | Dolby ............ 330/284 |
| 4,901,242 A | * | 2/1990 | Kotan ............ 700/108 |
| 5,103,557 A | * | 4/1992 | Leedy ............ 438/6 |
| 5,682,349 A | * | 10/1997 | Campardo et al. ..... 365/185.29 |
| 5,689,460 A | * | 11/1997 | Ooishi ............ 365/189.07 |
| 5,793,650 A | * | 8/1998 | Mirza ............ 702/34 |

(Continued)

FOREIGN PATENT DOCUMENTS

| JP | 11-070445 | 3/1999 |
|---|---|---|
| JP | 2002-333919 | 11/2002 |

OTHER PUBLICATIONS

Takahashi et al., "Oxygen Radical Treatment Applied to Ferroelectric Thin Film Films" 2003, Elsevier. p. 239-245.*
"Office Action of Korean Counterpart Application" issued on Feb. 23, 2010, p. 1-p. 5.

*Primary Examiner*—Albert DeCady
*Assistant Examiner*—Thomas H Stevens
(74) *Attorney, Agent, or Firm*—Jianq Chyun IP Office

(57) ABSTRACT

Provided is a method for managing manufacturing apparatuses used in a managed production line including a plurality of manufacturing processes for manufacturing an electronic device, each of the apparatuses being used in one or more of the processes. The method includes acquiring a property of a reference device manufactured in a predetermined reference production line including the manufacturing processes to be performed, performing at least one of the manufacturing processes in the managed production line, performing the other manufacturing processes in the reference production line, and manufacturing a comparison device. The method further includes measuring a property of the comparison device, comparing the measured properties of the reference and the comparison devices, and judging whether a manufacturing apparatus used in the at least one manufacturing process in the managed production line is defective or not, based on a property difference between the reference and the comparison devices.

22 Claims, 13 Drawing Sheets

U.S. PATENT DOCUMENTS

| | | | |
|---|---|---|---|
| 5,896,294 A * | 4/1999 | Chow et al. | 700/121 |
| 5,933,351 A * | 8/1999 | Balamurugan | 700/121 |
| 5,966,527 A * | 10/1999 | Krivokapic et al. | 703/14 |
| 5,982,662 A * | 11/1999 | Kobayashi et al. | 365/185.03 |
| 6,263,255 B1 * | 7/2001 | Tan et al. | 700/121 |
| 6,314,332 B1 * | 11/2001 | Kida | 700/113 |
| 6,341,241 B1 * | 1/2002 | Mugibayashi et al. | 700/110 |
| 6,473,665 B2 * | 10/2002 | Mugibayashi et al. | 700/110 |
| 6,507,800 B1 * | 1/2003 | Sheu | 702/117 |
| 6,522,939 B1 * | 2/2003 | Strauch et al. | 700/116 |
| 6,535,769 B1 * | 3/2003 | Konar | 700/14 |
| 6,542,830 B1 * | 4/2003 | Nakazato et al. | 702/35 |
| 6,629,009 B1 * | 9/2003 | Tamaki | 700/108 |
| 6,649,310 B2 * | 11/2003 | Itoh et al. | 430/5 |
| 6,757,580 B2 * | 6/2004 | Shimada et al. | 700/108 |
| 6,889,164 B2 * | 5/2005 | Okuda | 702/183 |
| 7,003,368 B2 * | 2/2006 | Koike et al. | 700/121 |
| 7,006,877 B2 * | 2/2006 | Hammon et al. | 700/19 |
| 7,052,624 B2 * | 5/2006 | Matsutani et al. | 216/84 |
| 7,065,460 B2 * | 6/2006 | Nishimura | 702/81 |
| 7,308,367 B2 * | 12/2007 | Steele et al. | 702/35 |
| 7,381,577 B2 * | 6/2008 | Slisher | 438/17 |
| 7,735,055 B2 * | 6/2010 | Tsutsui et al. | 716/21 |
| 2001/0018245 A1 * | 8/2001 | Kimizuka | 438/241 |
| 2003/0069658 A1 * | 4/2003 | Yamazaki | 700/97 |
| 2003/0130806 A1 * | 7/2003 | Mizuno et al. | 702/35 |
| 2004/0147121 A1 * | 7/2004 | Nakagaki et al. | 438/689 |
| 2006/0064191 A1 * | 3/2006 | Naya et al. | 700/116 |

* cited by examiner

METHOD AND APPARATUS FOR MANAGING MANUFACTURING EQUIPMENT, METHOD FOR MANUFACTURING DEVICE THEREBY

CROSS REFERENCE TO RELATED APPLICATION

This is a continuation application of PCT/JP2005/017755 filed on Sep. 27, 2005, the contents of which are incorporated herein by reference.

TECHNICAL FIELD

The present invention relates to a method and apparatus for managing a manufacturing apparatus used in a production line for an electronic device such as a semiconductor circuit, and a method for manufacturing the electronic device using the production line.

RELATED ART

Conventionally, an electronic device such as a semiconductor circuit is manufactured through some manufacturing processes such as cleaning, thermal, impurity doping, deposition, lithography, and etching processes. A certain manufacturing apparatus is used for each process Before manufactured electronic devices are shipped, a defective device is screened out by testing the electronic devices. Such a test is exemplified by measuring an electric property of the electronic device.

Moreover, the defective device is analyzed to identify factors that contribute to the defects. This analysis may lead to higher yields in the electronic device manufacturing process. For example, an electronic device is analyzed to determine which process is problematic in the series of the processes.

However, a geometry of the defective device conventionally needs to be measured to identify which process is problematic in the manufacture line. For example, a photomicrograph of the electronic device is used to evaluate the cause of the defect. Hence, the cause evaluation needs so much time that it is difficult to exactly identify which manufacturing apparatus causes the defects.

SUMMARY

It is therefore an object of an aspect of the innovations herein to provide a manufacturing apparatus managing method, a device manufacturing method, and a manufacturing apparatus managing system that can overcome the above-described problem. The above and other objects can be achieved by combinations described in the independent claims. The dependent claims define further advantageous and exemplary combinations of the innovations herein.

To overcome the above-described problem, according to an aspect related to the innovations herein, there is provided one exemplary method, for managing a plurality of manufacturing apparatuses used in a managed production line including a plurality of manufacturing processes for manufacturing an electronic device, each of the apparatuses being used in one or more of the processes. The method may include acquiring a property of a reference device manufactured in a predetermined reference production line including the plurality of manufacturing processes, performing at least one of the plurality of manufacturing processes in the managed production line, performing the other manufacturing processes in the reference production line, and manufacturing a comparison device. The method may further include measuring a property of the comparison device, comparing the measured properties of the reference device and the comparison device, and judging whether a manufacturing apparatus used in the at least one manufacturing process in the managed production line is defective or not, based on a property difference between the reference device and the comparison device.

According to another aspect related to the innovations herein, there is provided one exemplary system for managing a plurality of manufacturing apparatuses used in a managed production line including a plurality of manufacturing processes for manufacturing an electronic device, each of the apparatuses being used in one or more of the processes. The system may include a reference property measuring section that measures a property of a reference device manufactured in a predetermined reference manufacturing line including the plurality of manufacturing processes, and a comparison device manufacture control section that performs at least one of the plurality of manufacturing processes in the managed production line, performs the other manufacturing processes in the reference production line, and manufactures a comparison device. The system may further include a comparison property measuring section that measures a property of the comparison device, a property comparing section that compares the properties of the reference device and the comparison device, and a judging section that judges whether a manufacturing apparatus used in the at least one manufacturing process manufacturing process in the managed production line is defective or not based on a property difference between the reference and the comparison devices.

According to yet another aspect related to the innovations herein, there is provided one exemplary method for managing a plurality of manufacturing apparatuses used in a managed production line including a plurality of manufacturing processes for manufacturing an electronic device, each of the apparatuses being used in one or more of the processes, the method may include preparing a first device and a second device, both of which are manufactured by an identical production line, irradiating plasma to the first device by a plasma irradiation apparatus used in a predetermined reference production line that can perform the plurality of manufacturing processes, irradiating plasma to the second device by a plasma irradiation apparatus used in the managed production line, measuring properties of the first device and the second device, comparing the property of the first device and the property of the second device, and judging whether the plasma irradiation apparatus used in the managed production line is defective or not, based on a difference between the properties.

Note that the above summary of the invention is not intended to list all the necessary features of the present invention, but sub-combinations of these features can be an invention.

DESCRIPTION OF EXEMPLARY EMBODIMENTS

One aspect of the invention will now be described based on an embodiment, which do not intend to limit the scope of the present invention, but exemplify the invention. All of the features and the combinations thereof described in the embodiment are not necessarily essential to the invention.

Figure 1:
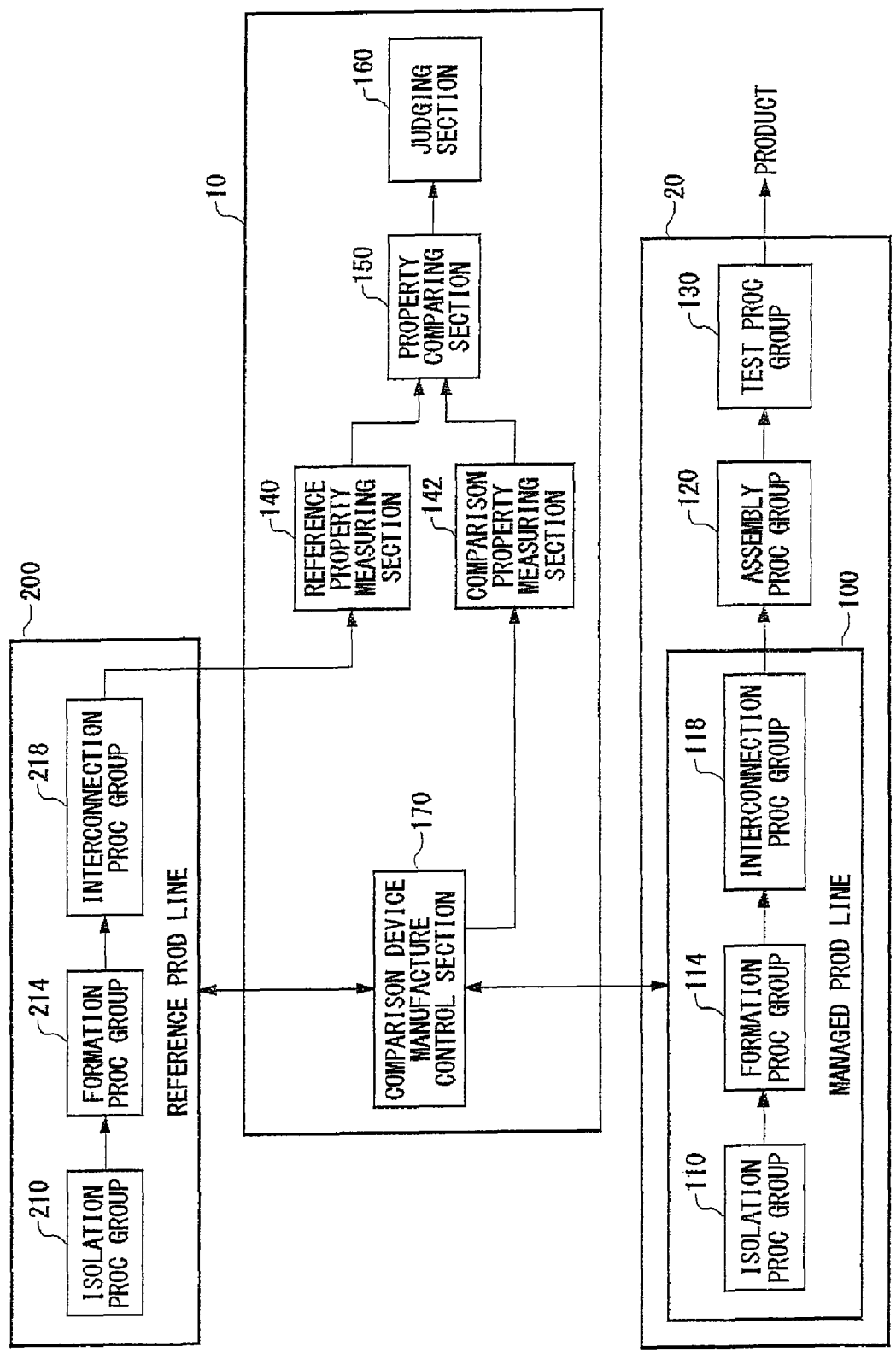
FIG. 1 is a diagram showing one example of the configuration of a managing apparatus 10 according to an embodiment of the present invention.

FIG. 1 is a diagram showing one example of the configuration of a managing apparatus 10 according to the present embodiment. The managing apparatus 10 manages manufacturing apparatuses each used in any of a plurality of manufacturing processes in a managed production line 100, through which an electronic device is manufactured by the manufacturing processes. In the present example, the managing apparatus 10 compares a property of a reference device that is manufactured by a predetermined reference production line 200 and a property of a comparison device that is manufactured by the managed production line 100 as to some manufacturing steps that are handled by those manufacturing apparatuses that are under management and by the reference production line 200 as to the other manufacturing steps, thereby to judge whether the manufacturing apparatuses that are under management are defective or not.

An electronic device is manufactured by a plurality of manufacturing process in the managed production line 100. These manufacturing processes are typically classified into an isolation process group 110, a formation process group 114, and an interconnection process group 118. The managed production line 100 may be included in a device manufacturing system 20, which is owned by, for example, a device manufacturer that supplies electronic devices to the market. The device manufacturing system 20 may include an assembly process group 120 and a test process group 130, as well as the managed production line 100. The system 20 allows the electronic devices to be manufactured, assembled, and tested.

The assembly process group 120 allows a electronic device to be diced from a wafer manufactured through the managed production line 100. The electronic device is then packaged. The assembly process group 120 may include: a scribing process, in which the electronic device is diced from the wafer; a die-bonding process, in which the electronic device is attached onto the package; a wire-bonding process, in which the chip is wired with the package; and a sealing process, in which gas is hermetically sealed into the package. These aforementioned processes are realized by a plurality of assembly apparatuses.

The test process group 130 allows the packaged electronic device product to be tested by a current test, a logic test or the like for screening out a defective product. The test process group 130 is realized by one or more test apparatuses.

The reference production line 200 allows manufacturing processes the same as those of the managed production line 100. The reference production line 200 may typically include an isolation process group 210, a formation process group 214, and an interconnection process group 218. In the reference production line 200, characteristics of each manufacturing apparatus used in each manufacturing process are preliminarily measured to assure that each manufacturing apparatus is not defective. The reference production line 200 may typically be owned by a public verification authority or a device manufacturer. Further, the reference production line 200 may typically be owned by a verification authority approved by electronic device users.

The production line under management 100 and the reference production line 200 allow electronic devices to be manufactured through a plurality of manufacturing processes. In the present embodiment, these production lines particularly allow a wafer on which electronic devices are formed to be manufactured. Further, in order to manage the manufacturing quality of each manufacturing process, a wafer that has a test circuit including a plurality of transistors under measurement is manufactured in the manufacturing lines. Here, the production lines may allow the electronic device and the test circuit to be separately formed, or may allow the test circuit to be formed inside the electronic device.

The managing apparatus 10 may include a reference property measuring section 140, a comparison property measuring section 142, a property comparing section 150, a judging section 160, and a comparison device manufacture control section 170. The reference property measuring section 140 acquires a property of a reference device that is manufactured with all the steps processed by the reference production line. The reference property measuring section 140 may measure, for example, an electric property of the reference device.

The comparison device manufacture control section 170 allows at least one of the manufacturing processes for manufacturing the electronic device to be processed by the managed production line 100, and also allows the other manufacturing processes to be processed by the reference production line 200. The comparison device manufacture control section 170 designates a manufacturing process to be used for processing the comparison device, for example, in the managed production line 100 and the reference production line 200. Further, the comparison device manufacture control section 170 may control a manufacturing apparatus in charge of the aforementioned manufacturing process so that the manufacturing apparatus conveys the comparison device and operates. The comparison device manufacture control section 170 may be prepared for each of the reference production line 200 and the managed production line 100. Further, the comparison device manufacture control section 170 may have a means for transporting an electronic device between the managed production line 100 and the reference production line 200 during the manufacturing.

The comparison property measuring section 142 measures a property of the comparison device. The reference property measuring section 140 measures the property of each device as to measurement items the same as those for the property of the reference device, which is acquired by the reference property measuring section 140. For example, the reference property measuring section 140 and the comparison property measuring section 142 acquire the same electric property for a TEG (Test Element Group) provided in each device.

The measurement items of the device property that should be acquired by the reference property measuring section 140 and the comparison property measuring section 142 may be preliminarily designated. The reference property measuring section 140 may notify the comparison property measuring section 142 of the items of the property to be acquired, or the comparison property measuring section 142 may notify the reference property measuring section 140 of the items of the property to be acquired.

The property comparing section 150 compares the property of the reference device acquired by the reference property measuring section 140 and the property of the comparison device measured by the comparison property measuring section 142. Based on the difference between the properties compared by the property comparing section 150, the judging section 160 judges whether the manufacturing apparatuses used in the manufacturing processes, in which the comparison device has been processed by the managed production line 100, are defective or not. For example, when the difference between the properties is within a predetermined range, the judging section 160 may determine that the manufacturing apparatuses are not defective. When the difference between the properties does not fall within the predetermined range, the judging section 160 may determine that the manufacturing apparatuses are defective. Preferably, the judging section 160 may notify the judgment results to the user of the managed production line 100.

This configuration enables the judgment of whether the manufacturing apparatuses are defective or not to be more precise. Further, it can be easier to judge whether the manufacturing apparatuses are defective or not, because the devices are merely compared in an electric property.

Figure 2:
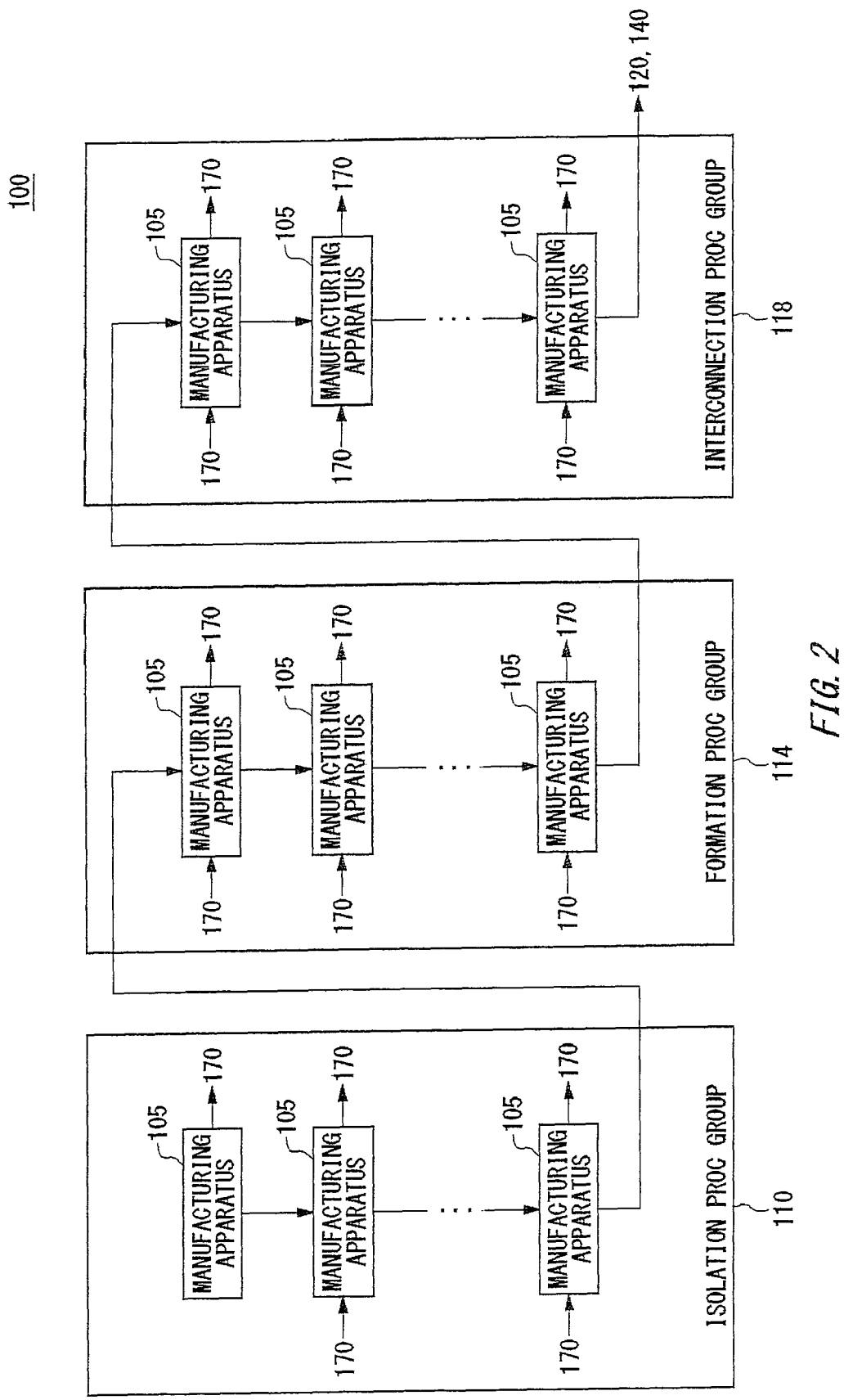
FIG. 2 is a diagram showing one example of the configuration of a production line under management 100.

FIG. 2 is a diagram showing one example of the configuration of the managed production line 100. In this example, the configuration of the managed production line 100 is shown, but the reference production line 200 may have the same configuration. As described above, the managed production line 100 may include manufacturing apparatuses 105 in each of the isolation process group 110, the formation process group 114, and the interconnection process group 118. Each of the manufacturing apparatus 105 may perform a corresponding manufacturing process.

Each manufacturing apparatus 105 performs a predetermined process to a provided wafer, and conveys the wafer to the subsequent manufacturing apparatus 105. The respective manufacturing apparatuses 105 perform their own processes sequentially, to form an electronic device on the wafer. When manufacturing a comparison device, each manufacturing apparatus 105 independently processes the wafer responding to the control of the comparison device manufacture control section 170. A wafer that the comparison device is to be formed on is carried from the reference production line 200 to the manufacturing apparatuses 105 that are to manufacture a comparison device, responding to the control of the comparison device manufacture control section 170. The wafer processed by the manufacturing apparatuses 105 is further carried to the reference production line 200 in response to the control of the comparison device manufacture control section 170.

The aforementioned control enables a selection of a manufacturing apparatus to be managed in the managed production line 100, and a manufacture of a comparison device that is processed by manufacturing processes corresponding to the selected apparatus in the managed production line 100, while by the other manufacturing processes in the reference production line 200.

The isolation process group 110, the formation process group 114, and the interconnection process group 118 may perform the following processes respectively. The isolation process group 110 electrically isolates the regions on the substrate, i.e., wafer, on which devices such as transistors are to be disposed, by using one or more manufacturing apparatuses 105. The formation process group 114 forms the devices on the wafer, by using one or more manufacturing apparatuses 105.

The isolation process group 110 and the formation process group 114 are also referred to as substrate process for forming devices such as transistors on the substrate, i.e., front end of the line (FEOL). The interconnection process group 118 forms interconnections that connect the devices formed on the wafer to each other, or connect the devices to the terminals by using one or more manufacturing apparatuses 105. The interconnection process group 118 is also called interconnect fabrication process for forming interconnects on the substrate on which the devices are formed, i.e., back end of the line (BEOL).

The isolation process group 110, the formation process group 114, and the interconnection process group 118 allow the resulting product of each process group to be manufactured by using one of the following processes or a plurality of them in combination. Here, one or more manufacturing apparatuses 105 perform the following steps. Instead, one manufacturing apparatus 105 may perform more than one of the following steps.

(1) Cleaning Process

This is a process of cleaning the substrate surface by clearing the substrate surface of particles, metal stains, or the like. Particularly, wet cleaning, dry cleaning, or the like may be employed.

(2) Thermal Process

This is a process including heating the wafer. This process may include a thermal oxidation process for growing a thermal oxide, an anneal process for activation after ion implantation, or the like.

(3) Impurity Doping Process

This is for introducing an impurity onto the substrate. For example, an impurity such as boron (B), phosphorus (P), or the like is introduced into a semiconductor substrate such as a silicon substrate by ion implantation or the like to form a PN junction.

(4) Deposition Process (Film Deposition Process)

A film of silicon oxide, silicon nitride, polysilicon, copper or the like is deposited on the substrate by CVD (Chemical Vapor Deposition), PVD (Physical Vapor Deposition), coating, electroplating, or the like.

(5) Lithography Process

A photoresist is coated on the substrate as a mask, exposed to form a pattern, and then developed.

(6) Etching Process

Portions of the underlying layer of the photoresist that appear as the photoresist is removed by the development are etched out, and the photoresist is removed. Plasma etching, reactive ion etching (RIE), or the like is employed.

(7) Planarization Process

The substrate surface is polished and planarized. CMP (Chemical and Mechanical Polishing) or the like is employed.

For example, a DRAM (Dynamic RAM) is manufactured through 500 to 600 processes. A CMOS-LSI is manufactured through, for example, 300 to 400 processes. The comparison device manufacture control section 170 may select any of the manufacturing processes described above, and cause the manufacturing apparatus 105 corresponding to the selected manufacturing process to operate in the managed production line 100.

Figure 3:
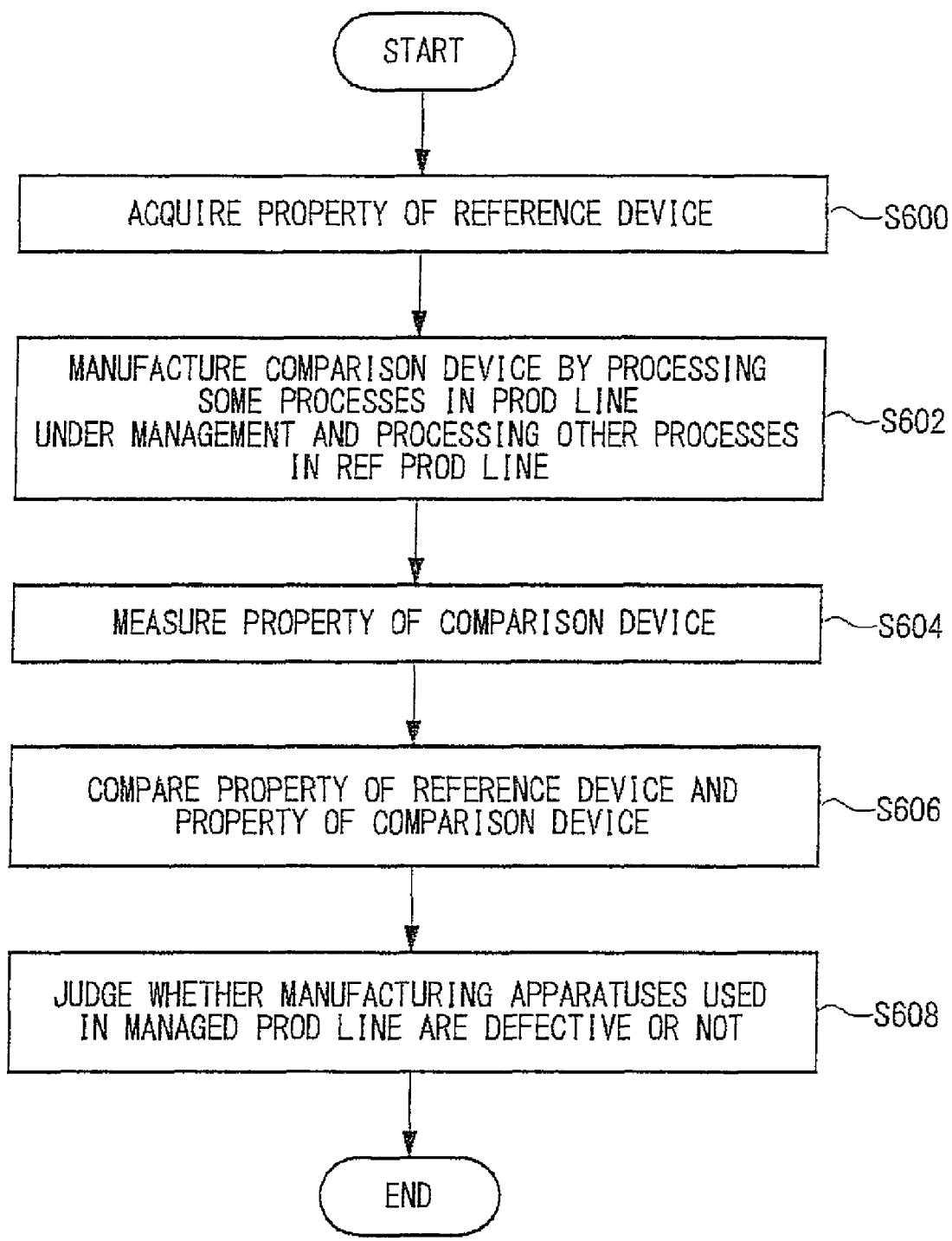
FIG. 3 is a flowchart showing one example of the operation of the managing apparatus 10.

FIG. 3 is a flowchart showing one example of the operation of the managing apparatus 10. First, in a reference property step S600, the reference property measuring section 140 acquires the property of the reference device. Next, in a comparison device manufacturing step S602, so as to manufacture a comparison device, the comparison device manufacture control section 170 allows some of the manufacturing processes, in which the corresponding manufacturing apparatus should be judged as to whether it is defective or not, to be performed in the managed production line 100 and also allows the other manufacturing processes to be performed in the reference production line 200.

Next, in a comparison property measuring step S604, the comparison property measuring section 142 measures the property of the comparison device. Then, in a property comparing step S606, the property comparing section 150 compares the property of the reference device and the property of the comparison device.

Then, in a judging step S608, the judging section 160 judges whether the manufacturing apparatuses used in the managed production line 100 are defective or not, based on the result of comparison. Through these steps, it is possible to judge whether the manufacturing apparatuses are defective or not. Further, a device manufacturer may manufacture an electronic device by a production line managed according to the managing method explained with reference to FIG. 3.

Figure 4:
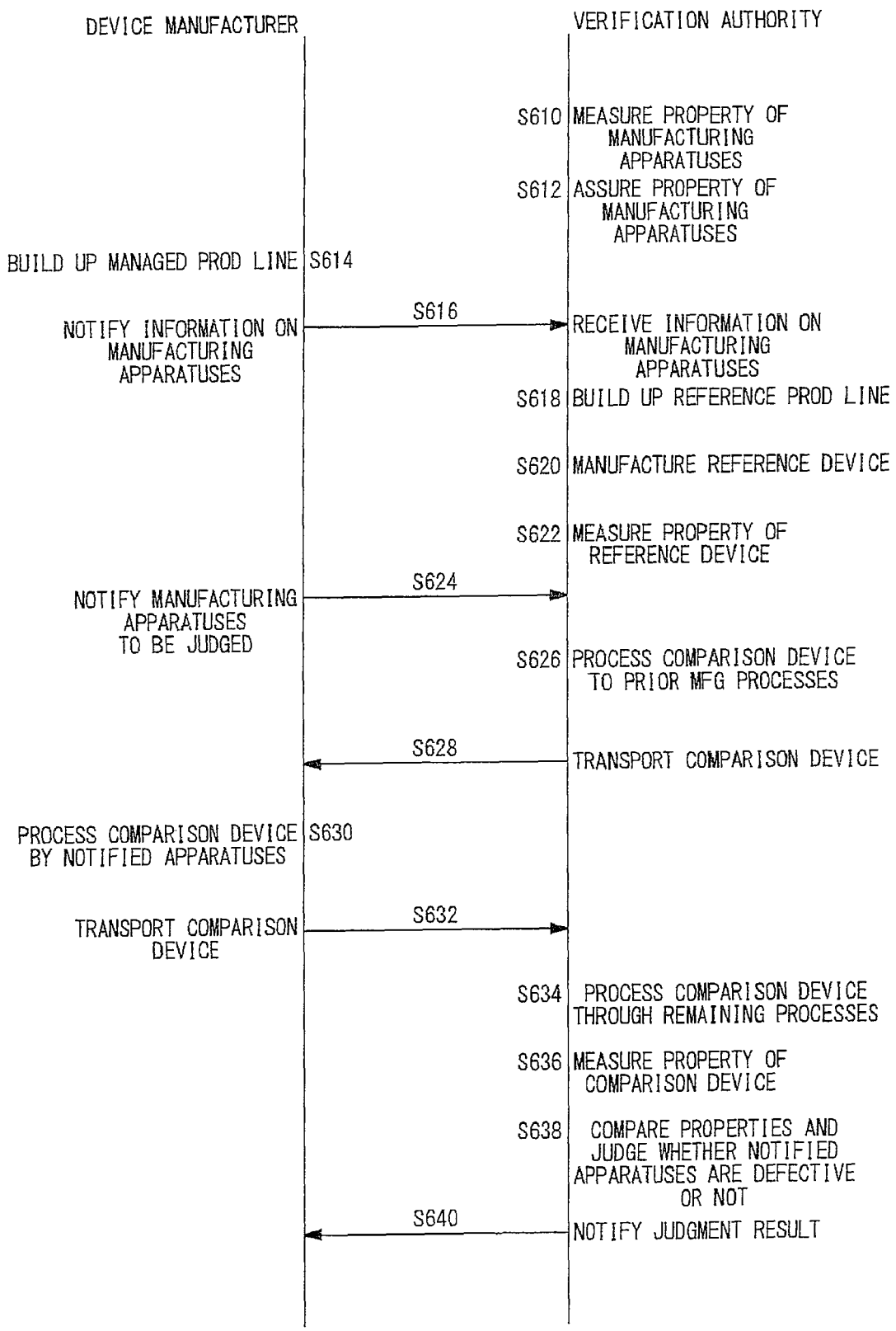
FIG. 4 is a chart showing one example of a process when a device manufacturer owns the production line under management 100 and an outside verification authority owns a reference production line 200.

FIG. 4 is a chart showing one example of a process that is followed when the managed production line 100 is owned by a device manufacturer and the reference production line 200 is owned by an outside verification authority. In this case, the verification authority may own the managing apparatus 10.

First, the verification authority measures in advance the properties of a plurality of manufacturing apparatuses 105 to be used in the reference production line 200 (S610). Then, the authority gives a pre-assurance that each manufacturing apparatus 105 is not defective (S612). In steps S610 and S612, the verification authority may measure an electric property of an electronic device manufactured by the reference production line 200, and when the electric property of the electronic device is within a predetermined range of acceptance, assure that the manufacturing apparatuses 105 are not defective. Further, the verification authority may have the respective manufacturing apparatuses 105 process a predetermined wafer and assure that the manufacturing apparatuses 105 are not defective when the difference between the property of the wafer before the process and that of the wafer after the process is within a predetermined range of an expected value. Further, the verification authority may have a plurality of wafers processed in step S610 and assure that the manufacturing apparatuses 105 are not defective when the properties of all the wafers are within a predetermined range of acceptance.

Next, the device manufacturer builds up a production line under management 100 which manufactures electronic devices to be shipped to the market (S614). The device manufacturer notifies the verification authority of the information on each manufacturing apparatus 105 included in the built-up production line under management 100 (S616).

The verification authority receives the information on the manufacturing apparatuses 105 used in the production line under management 100 (S616), and builds up a reference production line 200, which is the same as the managed production line 100, based on the received information (S618). At this time, the verification authority uses the manufacturing apparatuses 105 that are given the assurance as not defective in step S612 to build up the reference production line 200. In other examples, the verification authority may perform the steps S610 and S612 on the manufacturing apparatuses 105 that constitute the reference production line 200, after building up the reference production line 200.

The verification authority manufactures a reference device by the built-up reference production line 200 (S620). The verification authority measures a property of the manufactured reference device (S622). The device manufacturer selects a manufacturing apparatus 105 in the managed production line 100 to be judged as to whether the apparatus is defective or not, and notifies the verification authority of the selected apparatuses (S624).

The verification authority processes a wafer by the reference production line 200 and forms a halfway product of the comparison device to the prior manufacturing processes corresponding to the notified manufacturing apparatuses 105 (S626). Then, the verification authority transports the wafer processed in step S626 to the device manufacturer (S628).

The device manufacturer processes the received wafer by the notified manufacturing apparatuses 105 of the production line under management 100 (S630). Then, the device manufacturer transports the wafer processed by these manufacturing apparatuses 105 to the verification authority (S632).

The verification authority processes the received wafer through the rest of the manufacturing processes by the reference production line 200, thereby completing the comparison device (S634). Then, the verification authority measures the property of the comparison device (S636), and compares the comparison device property with the property of the reference device to judge whether the notified manufacturing apparatuses 105 are defective or not (S638). Then, the verification authority notifies the judgment result on the manufacturing apparatuses 105 to the device manufacturer (S640). Through this process, the device manufacturer may have the quality of these manufacturing apparatuses 105 verified by an outsider.

Figure 5:
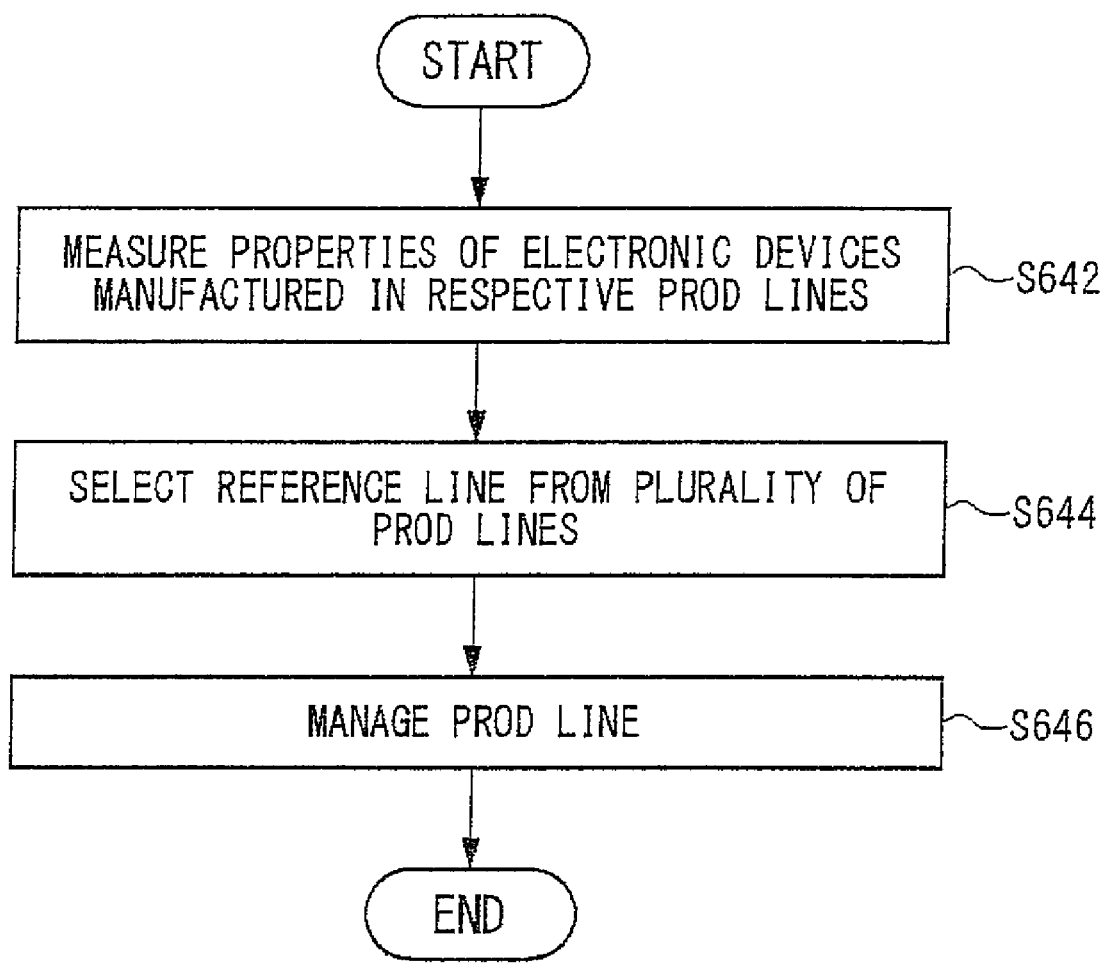
FIG. 5 is a flowchart showing one example of a process when one of the production lines owned by a device manufacturer functions as the reference production line 200 and the other production lines function as production lines under management 100.

FIG. 5 is a flowchart showing one example of a process when one of the production lines owned by a device manufacturer functions as a reference production line 200 and the other production lines function as production lines under management 100. In this example, the plurality of production lines owned by the device manufacturer may produce electronic devices through the same manufacturing processes.

First, the device manufacturer manufactures electronic devices by the respective production lines and measures the properties of the respective electronic devices manufactured (S642). Then, the device manufacturer selects a reference production line 200 from the production lines based on the properties of the electronic devices measured (S644). For example, the device manufacturer selects as the reference production line 200 a production line that has produced an electronic device whose property is the closest to a predetermined reference value. Here, the device manufacturer may produce a plurality of electronic devices by each production line, calculate the average of the properties of the electronic devices for each production line, and select the production line that achieves the average value closest to the reference value.

Then, the device manufacturer manages the rest of the production lines that are not selected as the reference production line 200, as managed production lines 100 (S646). The management in step S646 may be performed to each production line, for example, according to the processes shown in FIG. 3.

Figure 6:
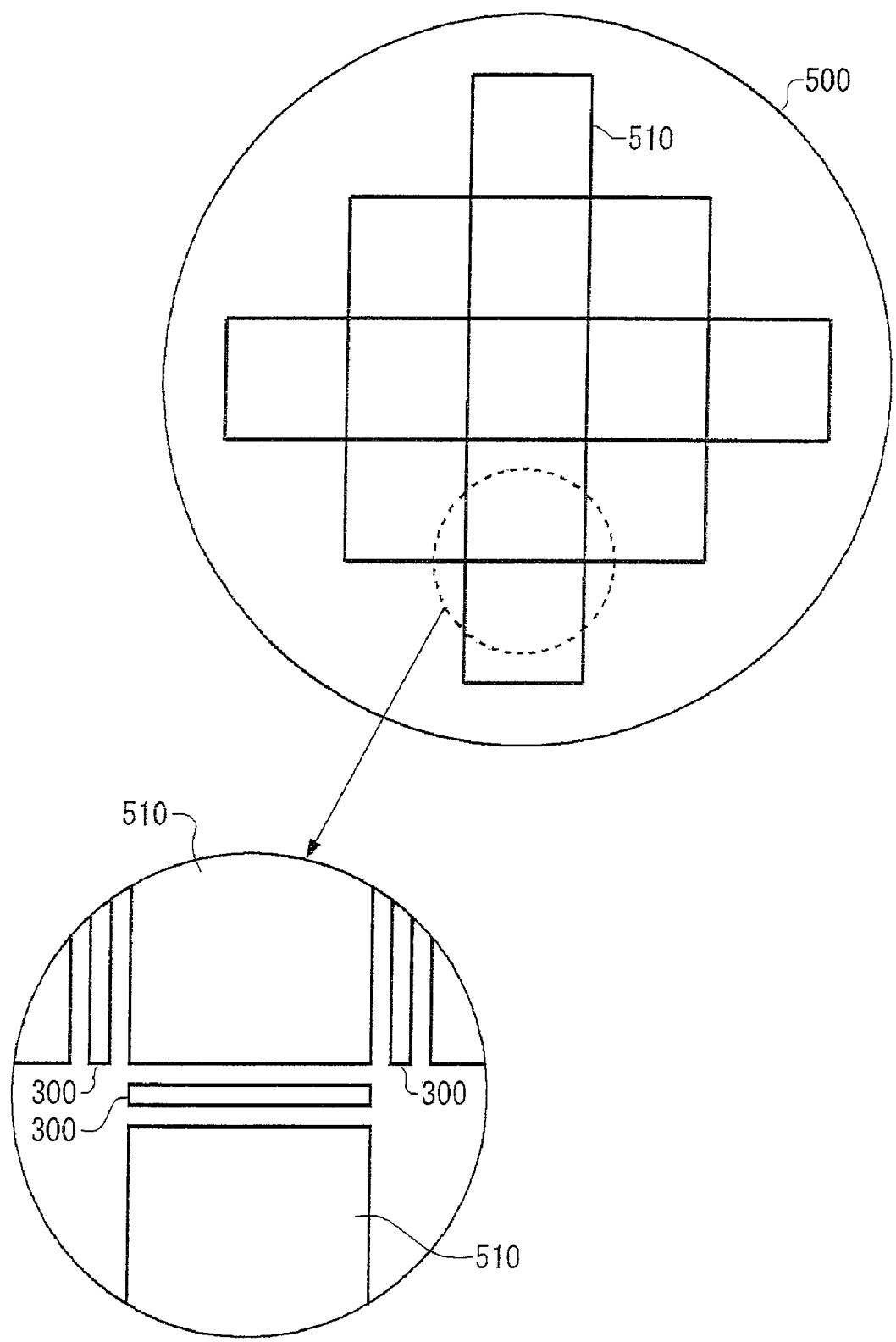
FIG. 6 shows one example of a plan view of a wafer 500 on which a plurality of electronic devices 510 are formed by the production line under management 100 or by the reference production line 200.

FIG. 6 shows one example of a plan view of a wafer 500, on which a plurality of electronic devices 510 are formed by the managed production lines 100 or the reference production line 200. For the purposes of production line management or yield management, the managed production lines 100 may manufacture a wafer 500, which has: a plurality of test circuits 300 each including a plurality of transistors under measurement; and a plurality of electronic devices 510. The electronic devices 510 are devices to be on sale, which are to be shipped as devices of practical application.

The test circuits 300 may be provided per boarder between the electronic devices 510. In this case, the plurality of test circuits 300 may be provided on the dicing regions at which the plurality of electronic devices 510 are separated from each other when diced. Instead, the test circuits 300 may be provided inside the electronic devices 510. Or, a wafer 500, which is used for the production line management purpose, may have just a plurality of test circuits 300 alone formed thereon. The reference property measuring section 140 and the comparison property measuring section 142 may measure electric properties of the test circuits 300 that are formed for the reference device or for the comparison device.

The reference property acquiring step S600 and the comparison device manufacturing step S602 explained with reference to FIG. 3 may manufacture an electronic device or a wafer having a test circuit, which is to be explained with reference to FIG. 7 or 11, through a plurality of manufacturing processes.

Figure 7:
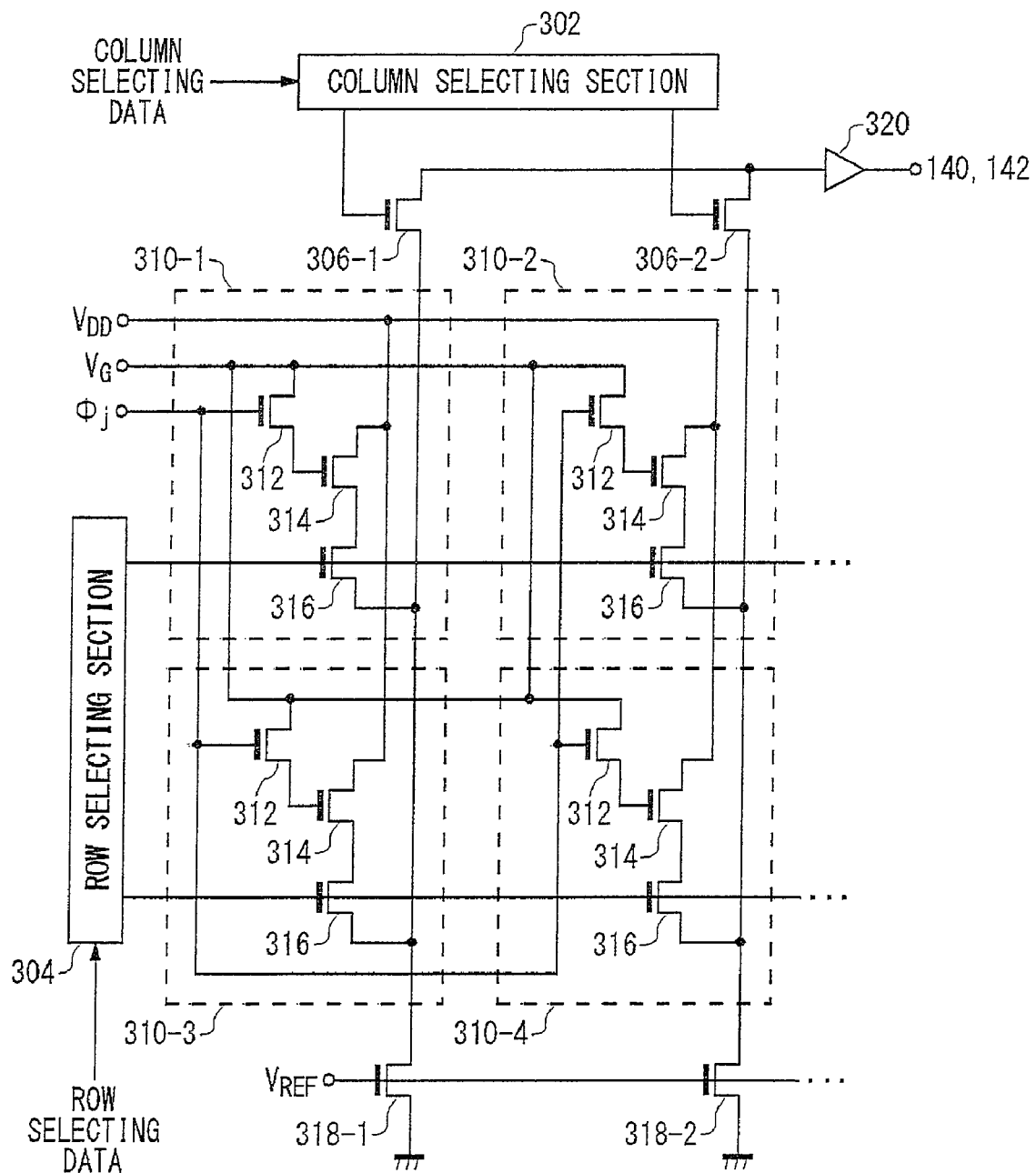
FIG. 7 is a diagram showing one example of the circuit configuration of a test circuit 300.

FIG. 7 shows one example of the circuit configuration of a test circuit 300. The test circuit 300 enables the respective electric properties of a plurality of transistors under measurement 314 to be efficiently measured. Hence, the reference property measuring section 140 and the comparison property measuring section 142 can obtain a sufficient number of measurement sample transistors for the electric properties to be measured. As a result, the reference property measuring section 140 and the comparison property measuring section 142 can achieve precise comparison between the property of the reference device and that of the comparison device.

The test circuit 300 includes a column selecting section 302, a row selecting section 304, a plurality of column selecting transistors (306-1 and 306-2, hereinafter collectively referred to as 306), a plurality of current sources (318-1 and 318-2, hereinafter collectively referred to as 318), an output section 320, and a plurality of cells (310-1 to 310-4, hereinafter collectively referred to as 310). The column selecting transistors 306 further include the plurality of current sources (318-1 to 2), which are provided in correspondence with plural columns of cells 310 respectively to make a designated source-drain current flow across a cell 310 to which a selecting signal is input from the row selecting section 304.

The plurality of cells 310 are one example of a circuit under measurement according to the present embodiment, and arranged within the surface of the wafer 500 in the shape of a two-dimensional matrix of row and column dimensions. The plurality of cells 310 are provided in parallel with each other along both the row direction and the column direction of the two-dimensional matrix. In the present example, a circuit having two cells 310 in each row and each column is shown, but more cells 310 can be provided in each row and each column. The plurality of cells 310 are arranged across a plurality of divisional regions. For example, each of the divisional regions includes 128 columns of cells 310 in the row direction and 512 rows of cells 310 in the column direction. In this case, the process rule or device size of the devices included in the cells 310 may vary from region to region.

Each cell 310 may include a transistor under measurement 314, a switching transistor 312, and a row selecting transistor 316. The transistors of each cell 310 may be MOS transistors that are formed through the same process as practically-applicable transistors included in the electronic device 510.

The transistors under measurement 314 of the respective cells 310 are arranged in electrically parallel with each other. The present embodiment will explain a case where the transistor under measurement 314 is an NMOS transistor. Instead, the transistor under measurement 314 may be a PMOS transistor, in which case, a circuit in which sources and drains are transposed may be used.

A predetermined reference voltage $V_{DD}$ is input to a reference voltage side terminal of each transistor under measurement 314, which is either the drain terminal or the source terminal of the transistor under measurement 314. The wire for each cell 310, through which the externally supplied reference voltage is supplied to the reference voltage side terminal of the transistor under measurement, functions as a reference voltage input section according to the present embodiment. Here, the reference voltage side terminal may be the drain terminal when the transistor under measurement 314 is an NMOS transistor, or a source terminal when the transistor under measurement 314 is a PMOS transistor. The terminal of the transistor under measurement 314 that supplies thereto a well voltage is not shown, but the well voltage terminal may be connected to a ground potential, or the well voltage terminal and source terminal of the transistor under measurement 314 may be connected to each other with independent controllability of the well voltage per transistor. The voltages $V_{DD}$, $V_G$, $\phi_j$, and $V_{REF}$ shown in FIG. 7 may be supplied to the test circuit 300 by the reference property measuring section 140 or the comparison property measuring section 140 shown in FIG. 1.

The switching transistor 312 of each cell 310 is provided in correspondence with the transistor under measurement 314 of the cell. Each switching transistor 312 functions as a gate voltage control section that applies a gate voltage designated by the reference property measuring section 140 or the comparison property measuring section 142 to the gate terminal of the corresponding transistor under measurement 314. In the present example, when the switching transistor 312 is an NMOS transistor, the switching transistor 312 has its drain terminal supplied with a predetermined voltage $V_G$, its gate terminal supplied with the voltage $\phi_j$, which controls the operation of the switching transistor 312, and its source terminal connected to the gate terminal of the transistor under measurement 314. That is, the switching transistor 312 applies a voltage substantially equal to the voltage $V_G$ to the gate terminal of the transistor under measurement 314 when the switching transistor 312 is turned on by the voltage φ$_j$, and applies a floating voltage, whose initial value is substantially V$_G$, to the gate terminal of the transistor under measurement 314 when turned off.

FIG. 7 shows an example where the voltage φ$_j$ is simultaneously applied to all the cells 310. In other examples, the voltage φ$_j$ may be applied from the row selecting section 304 sequentially to the cells arranged in a column direction in the form of a pulse signal so that all the cells have the uniform leakage period when a PN junction leakage current is measured.

The row selecting transistor 316 of each cell 310 is provided in correspondence with the transistor under measurement of the cell. Each row selecting transistor 316 functions as a terminal voltage output section that outputs, as its output voltage, the terminal voltage of a terminal, which is either the drain terminal or the source terminal of the transistor under measurement 314 that is not the reference voltage side terminal, on the condition that a selecting signal is input to the cell 310 from outside. In the present example, when the row selecting transistor 316 is a PMOS transistor, the source terminal of the row selecting transistor 316 is connected to the drain terminal of the transistor under measurement 314. The drain terminal of the row selecting transistor 316 is connected to the drain terminal of the corresponding column selecting transistor 306. That is, the drain terminal of each column selecting transistor 306 is connected to the drain terminals of the plurality of row selecting transistors 316 corresponding thereto.

The row selecting section 304 outputs a selecting signal to the cells 310 in a designated row, among the plurality of cells 310 arranged in the two-dimensional matrix. By doing so, the row selecting section 304 sequentially selects plural groups of cells 310, which groups are arranged in the column direction (in the present example, the groups are a cell group (310-1 and 310-2) and a cell group (310-3 and 310-4)). The column selecting section 302 selects, out of the two or more cells 310 disposed in the row to which the selecting signal is input, a cell 310 that is in a designated column, so that the terminal voltage of the selected cell 310 is output to an output signal line. By doing so, the column selecting section 302 sequentially selects plural groups of cells 310, which groups are arranged in the row direction (in the present example, the groups are a cell group (310-1 and 310-3) and a cell group (310-2 and 310-4)). With this configuration, the row selecting section 304 and the column selecting section 302 can sequentially select the respective cells 310.

In the present example, the row selecting section 304 may control the plurality of row selecting transistors 316 provided in each column cell group to be sequentially turned on per row position according to row selecting data supplied from the reference property measuring section 140 or the comparison property measuring section 142. Further, the column selecting section 302 may control the plurality of column selecting transistors 306 provided respectively for the cell groups arranged in a row direction to be sequentially turned on per column position according to column selecting data supplied from the reference property measuring section 140 or the comparison property measuring section 142. Hence, the column selecting section 302 and the row selecting section 304 can function as a selecting section according to the present embodiment, to enable the output signal of one cell 310 designated by the measurement control section 146 to be output through an output signal line, which is provided in common to the plurality of cells 310, connecting each column selecting transistor 306 with the output section 320, and through the output section 320.

The reference property measuring section 140 or the comparison property measuring section 142 may supply the row selecting section 304 and the column selecting section 302 with a selecting signal for sequentially selecting each cell 310. The column selecting section 302 and the row selecting section 304 may include a circuit such as a decoder, a shift register, or the like, which converts column selecting data and row selecting data supplied thereto into a selecting signal corresponding to the position of the cell 310 to be selected. Here, a selecting signal is a signal that turns on the column selecting transistor 306 and row selecting transistor 316, which correspond to the cell 310 to be selected in response to the selecting data.

With this configuration, the reference property measuring section 140 or the comparison property measuring section 142 sequentially selects the transistors under measurement 314 provided in the respective cells 310. This enables the terminal voltages of the respective transistors under measurement 314 sequentially selected to be output sequentially to the output section 320. The output section 320 sequentially outputs the terminal voltages to the reference property measuring section 140 or the comparison property measuring section 142. The output section 320 may be, for example, a voltage follower buffer. The reference property measuring section 140 or the comparison property measuring section 142 measures electric properties of each transistor under measurement 314, such as its threshold voltage, current-voltage characteristic, low-frequency noise, PN junction leakage current, and the like, based on the terminal voltage of the transistor under measurement 314.

Each current source 318 is a MOS transistor that receives a predetermined voltage V$_{REF}$ at its gate terminal. Each current source 318 has its drain terminal connected to the drain terminals of a plurality of row selecting transistors 316 corresponding thereto. That is, each current source 318 is provided in common to a plurality of transistors under measurement 314 arranged in the same column, to prescribe the source-drain current that flows through each corresponding transistor under measurement 314.

According to the circuit configuration shown in FIG. 7, the plurality of transistors under measurement 314 in each test circuit 300 can sequentially be selected electrically, and the terminal voltages of the selected transistors under measurement 314 can be sequentially output, so that the terminal voltage of each transistor under measurement 314 can be measured at a high speed within a short time. Therefore, even when many transistors under measurement 314 are formed on the wafer 500, all the transistors under measurement 314 can be measured in a short time.

Hence, the reference property measuring section 140 or the comparison property measuring section 142 can measure the electric property of the reference device or the comparison device efficiently and precisely. In the present example, about ten thousand to ten million or 10,000 to 10,000,000 transistors under measurement 314 may be provided within the surface of the wafer 500. By conducting measurement on many transistors under measurement 314, it is possible to obtain a precise calculation of any variation in the properties of the transistors under measurement 314.

Figure 8:
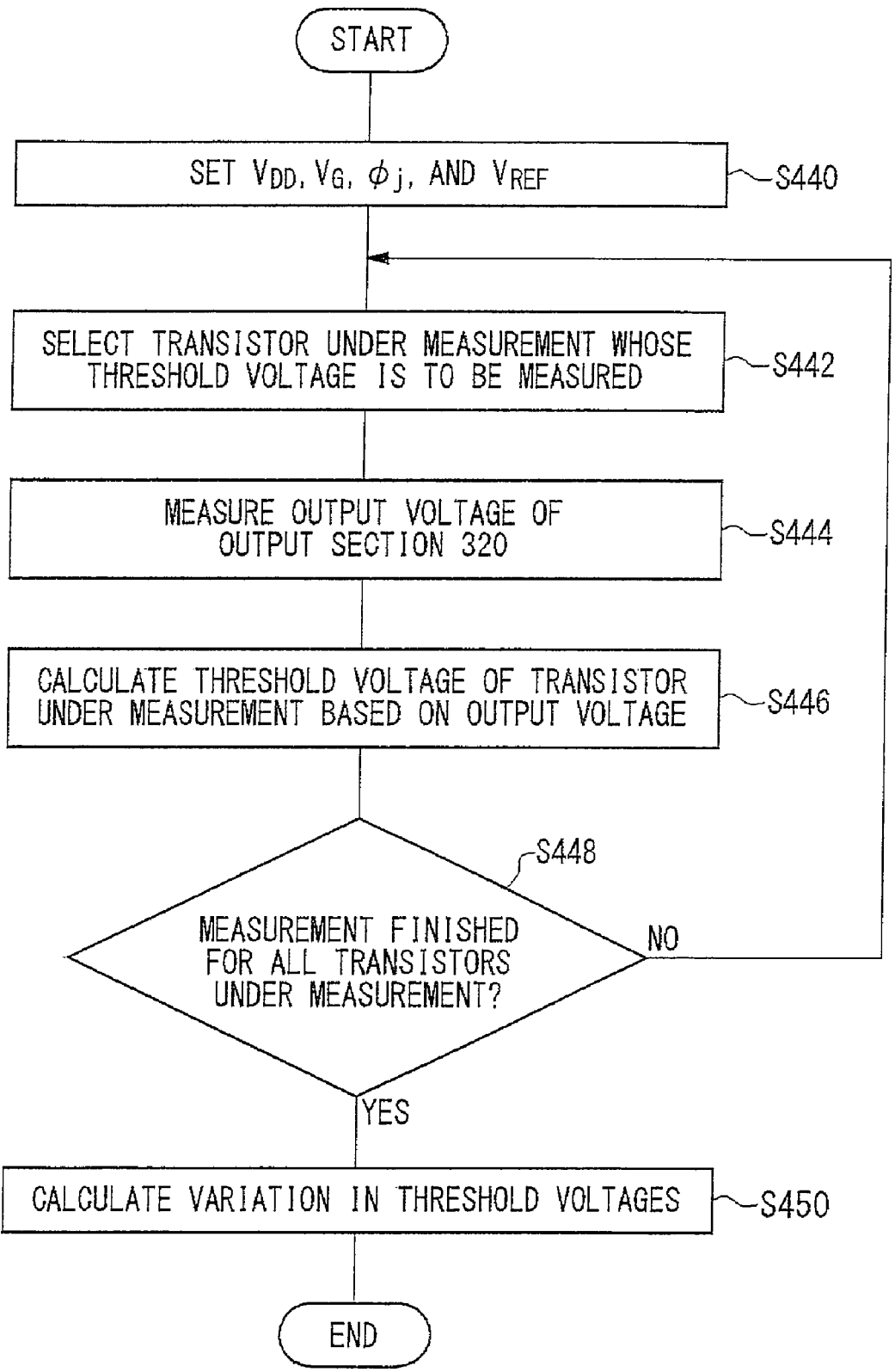
FIG. 8 is a flowchart showing one example of the operation of a reference property measuring section 140 or a comparison property measuring section 142 when it measures any variation in the threshold voltage values of respective transistors under measurement 314, as a property of a reference device and a comparison device.

FIG. 8 is a flowchart showing one example of the operation of the reference property measuring section 140 or the comparison property measuring section 142, in measuring, as the property of the reference device and comparison device, variation in the threshold voltage values of the respective transistors under measurement 314.

First, the reference property measuring section 140 or the comparison property measuring section 142 supplies the test circuit 300 with the voltages $V_{DD}$, $V_G$, $\phi_j$, and $V_{REF}$ explained with reference to FIG. 7 (S440). Here, the reference property measuring section 140 or the comparison property measuring section 142 functions as a current control section that supplies each current source 318 with a constant voltage $V_{REF}$ to make the respective current sources 318 generate the same constant current. Further, the reference property measuring section 140 or the comparison property measuring section 142 supplies the gate voltage $V_G$ that turns on the transistors under measurement 314, and the voltage $\phi_j$ that turns on the respective switching transistors 312. By having this control, the reference property measuring section 140 or the comparison property measuring section 142 functions as a gate control section that controls the gate voltage, which turns on each transistor under measurement 314, to be applied to the gate terminal of the transistor under measurement 314.

Next, the reference property measuring section 140 or the comparison property measuring section 142 supplies the column selecting section 302 and the row selecting section 304 with selecting data that selects a transistor under measurement 314, whose threshold voltage is to be measured (S442). Thereby, the reference property measuring section 140 or the comparison property measuring section 142 controls the column selecting section 302 and the row selecting section 304 to select the plurality of cells 310 sequentially. Then, the reference property measuring section 140 or the comparison property measuring section 142 measures the output voltage of the output section 320 (S444). Thus, the reference property measuring section 140 or the comparison property measuring section 142 can measure the electric property of the transistor under measurement 314 included in each cell 310, based on the output signal output from the selected cell 310 to the output signal line.

Next, the reference property measuring section 140 or the comparison property measuring section 142 calculates the threshold voltage value of each transistor under measurement 314, based on the gate voltage $V_G$ applied to the that transistor under measurement 314 and the output voltage from the output section 320 (S446). It is possible to obtain the threshold voltage value of a transistor under measurement 314, for example, by calculating the difference between the gate voltage $V_G$ and the output voltage, i.e., the gate-source voltage of the transistor under measurement 314.

Next, the reference property measuring section 140 or the comparison property measuring section 142 determines whether the threshold voltage value has been measured for all the transistors under measurement 314 (S448), selects the next transistor under measurement 314 if there is any transistor under measurement 314 yet to be measured, and repeats the processes of S444 and S446 for the selected transistor under measurement 314. When the threshold voltage value has been measured for all the transistors under measurement 314, the reference property measuring section 140 or the comparison property measuring section 142 calculates any variation in the threshold voltage values (S450).

With this operation, any variation in the threshold voltage values of the plurality of transistors under measurement 314 can be measured efficiently. Further, any variation in the threshold voltage values of the transistors under measurement 314 can be measured process rule by process rule. Furthermore, by conducting measurement for a plurality of test circuits 300 formed on the wafer 500, it is possible to measure the distribution of variations in the threshold voltage values on the surface of the wafer 500.

Figure 9:
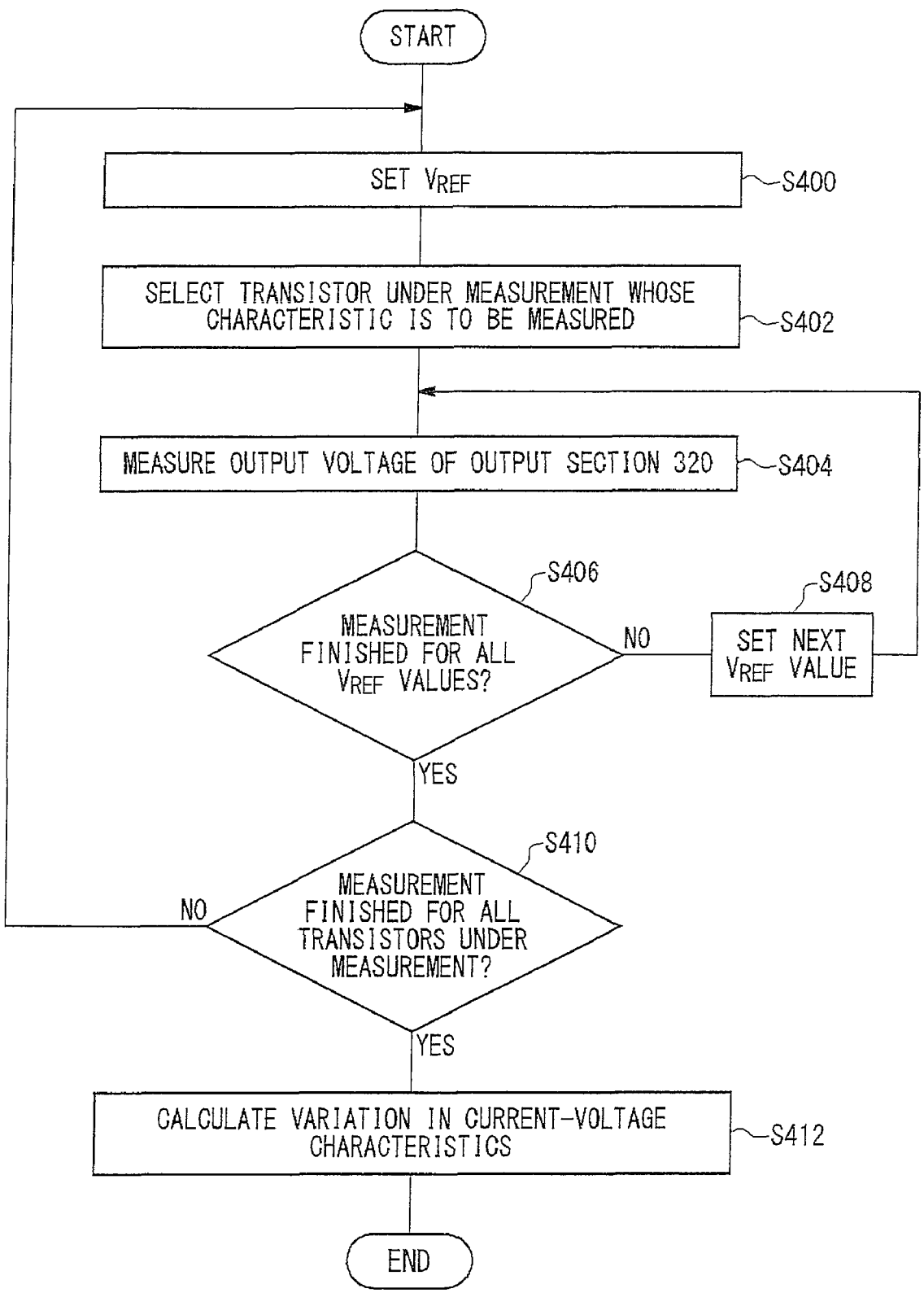
FIG. 9 is a flowchart showing one example of the operation of the reference property measuring section 140 or the comparison property measuring section 142 when it measures any variation in the current-voltage characteristic data of the respective transistors under measurement 314 as a property of the reference device and the comparison device.

FIG. 9 is a flowchart showing one example of the operation of the reference property measuring section 140 or the comparison property measuring section 142, when it measures any variation in the current-voltage characteristic data of the respective transistors under measurement 314 as the property of the reference device and the comparison device.

First, the reference property measuring section 140 or the comparison property measuring section 142 supplies the test circuit 300 with the voltages $V_{DD}$, $V_G$, $\phi_j$, and $V_{REF}$, which have been explained with reference to FIG. 7 (S400). Here, the reference property measuring section 140 or the comparison property measuring section 142 supplies a constant voltage $V_{REF}$ to the current sources 318 to make the current sources 318 generate the same constant current. Further, the reference property measuring section 140 or the comparison property measuring section 142 supplies the gate voltage $V_G$ that turns on the transistor under measurement 314, and the voltage $\phi_j$ that turns on each switching transistor 312.

Next, the reference property measuring section 140 or the comparison property measuring section 142 supplies the column selecting section 302 and the row selecting section 304 with selecting data that selects the transistor under measurement 314, whose current-voltage characteristic data is to be measured (S402). Then, the reference property measuring section 140 or the comparison property measuring section 142 changes the voltage $V_{REF}$ within a predetermined range at a predetermined resolution (S406 to S408). At this time, the reference property measuring section 140 or the comparison property measuring section 142 measures the output voltage of the output section 320 for each value of $V_{REF}$ (S404). That is, the reference property measuring section 140 or the comparison property measuring section 142 gradually changes the source-drain current generated by the current source 318 and measures the source voltage of the transistor under measurement 314 at each changed value of the source-drain current. By this operation, the current-voltage characteristic of the transistor under measurement 314 can be measured.

Then, the reference property measuring section 140 or the comparison property measuring section 142 determines whether the current-voltage characteristic has been measured for all the transistors under measurement 314 (S410). When there is any transistor under measurement 314 not yet measured, the reference property measuring section 140 or the comparison property measuring section 142 repeats the processes of S400 to S410. Here, in step S402, the reference property measuring section 140 or the comparison property measuring section 142 selects the next transistor under measurement 314.

When the current-voltage characteristic has been measured for all the transistors under measurement 314, the reference property measuring section 140 or the comparison property measuring section 142 calculates any variation in the current-voltage characteristic data (S412). For example, the reference property measuring section 140 or the comparison property measuring section 142 calculates the transconductance gm of each current-voltage characteristic data to calculate any variation in the transconductance values gm. Further, the reference property measuring section 140 or the comparison property measuring section 142 calculates the slope swing or the silicon gate insulator interface state density from the current-voltage characteristic of the subthreshold domain, and calculates any variation in the values.

Figure 10:
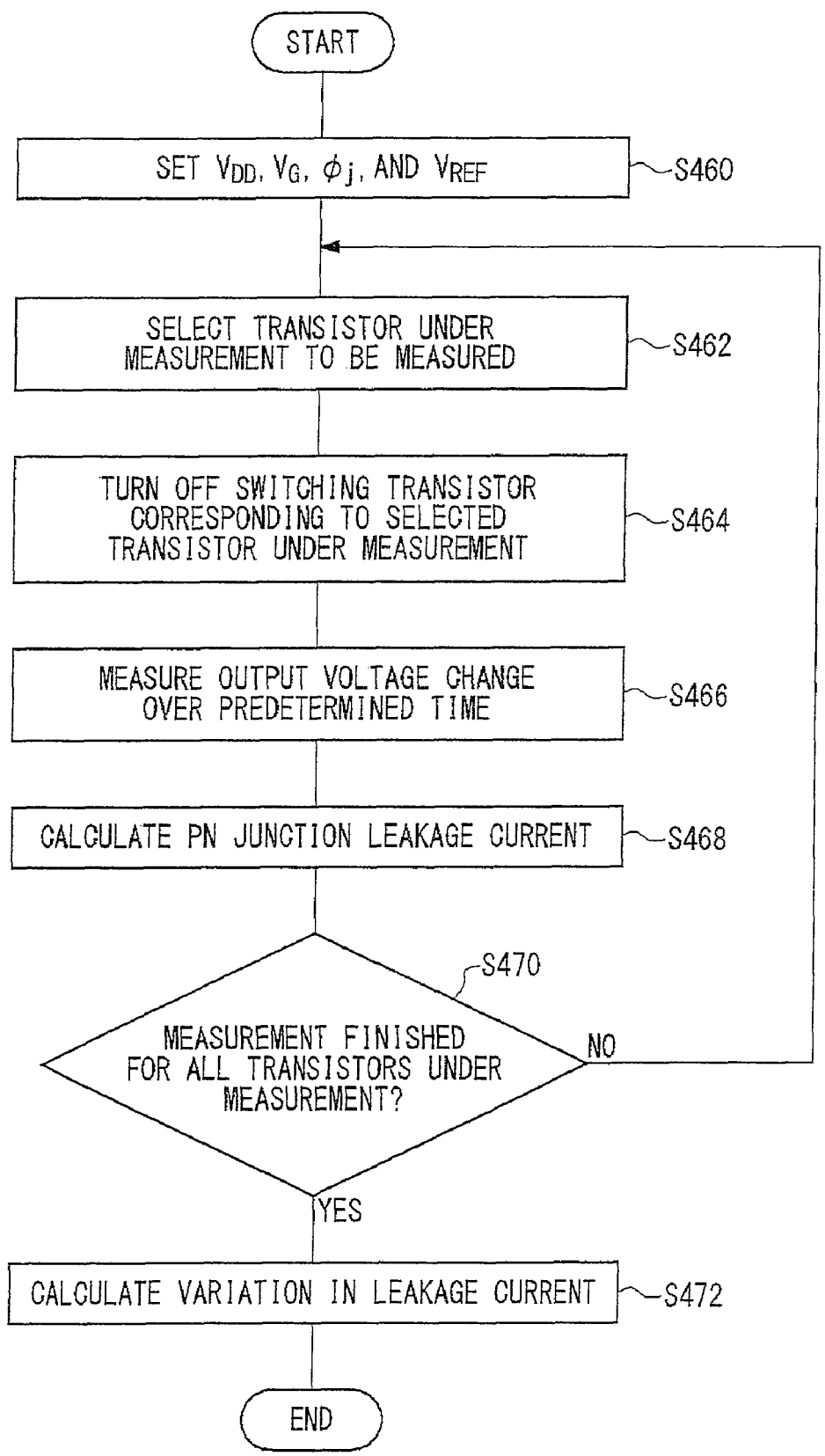
FIG. 10 is a flowchart showing one example of the operation of the reference property measuring section 140 or the comparison property measuring section 142 when it measures any variation in the PN junction leakage current values of the respective transistors under measurement 314 as a property of the reference device and the comparison device.

FIG. 10 is a flowchart showing one example of the operation of the reference property measuring section 140 or the comparison property measuring section 142, when it measures any variation in the PN junction leakage current values of the respective transistors under measurement 314 as the property of the reference device and the comparison device.

Each switching transistor 312 has a PN junction, which is joined to the gate terminal of the corresponding transistor under measurement 314. In the present example, the leakage current at this PN junction is measured.

First, the reference property measuring section 140 or the comparison property measuring section 142 supplies the test circuit 300 with the voltages $V_{DD}$, $V_G$, $\phi_j$, and $V_{REF}$, which have been explained with reference to FIG. 7 (S460). Here, the reference property measuring section 140 or the comparison property measuring section 142 supplies a constant voltage $V_{REF}$ to the respective current sources 318 to make the current sources 318 generate the same constant current. Further, the reference property measuring section 140 or the comparison property measuring section 142 supplies the gate voltage $V_G$ that turns on the transistor under measurement 314, and the voltage $\phi_j$ that turns on each switching transistor 312. Further, the leakage current may be measured in the same duration for all the cells, because the row selecting section 304 sequentially supplies pulse signals to each of the cells 310 arranged in a row direction.

Next, the reference property measuring section 140 or the comparison property measuring section 142 supplies the column selecting section 302 and the row selecting section 304 with selecting data that selects the transistor under measurement 314, whose PN leakage current value is to be measured (S462). Then, the reference property measuring section 140 or the comparison property measuring section 142 turns off the switching transistor 312 corresponding to the selected transistor under measurement 314 (S464). That is, the reference property measuring section 140 or the comparison property measuring section 142 allows each switching transistor 312 to sequentially apply a gate voltage that turns on the transistor under measurement 314 and a gate voltage that turns off the transistor under measurement 314 to the corresponding transistor under measurement 314.

Next, the reference property measuring section 140 or the comparison property measuring section 142 measures the source voltage of the transistor under measurement 314 in an on state, and the source voltage of the transistor under measurement 314 when a predetermined period elapses after the on state switches to an off state (S466). In the present example, the reference property measuring section 140 or the comparison property measuring section 142 measures any change in the output voltage of the output section 320 during that predetermined period.

Next, the reference property measuring section 140 or the comparison property measuring section 142 calculate the leakage current at the PN junction, based on the change in the source voltage (S468). When the switching transistor 312 is in an on state, the transistor under measurement 314 has charges stored in the gate capacitance corresponding to the gate voltage. When the switching transistor 312 switches to an off state, the gate capacitance is discharged as the leakage current at the PN junction. Hence, the magnitude of the PN junction leakage current is determined by how much the source voltage of the transistor under measurement 314 has changed over the predetermined period.

Next, the reference property measuring section 140 or the comparison property measuring section 142 determines whether the PN junction leakage current value has been measured for all the transistors under measurement 314 (S470). When there is any transistor under measurement 314 that has not yet been measured, the reference property measuring section 140 or the comparison property measuring section 142 repeats the processes of S462 to S470. Here, in step S462, the reference property measuring section 140 or the comparison property measuring section 142 selects the next transistor under measurement 314. When the PN junction leakage current value has been measured for all the transistors under measurement 314, the reference property measuring section 140 or the comparison property measuring section 142 calculate any variation in the PN junction leakage current values (S472).

Figure 11:
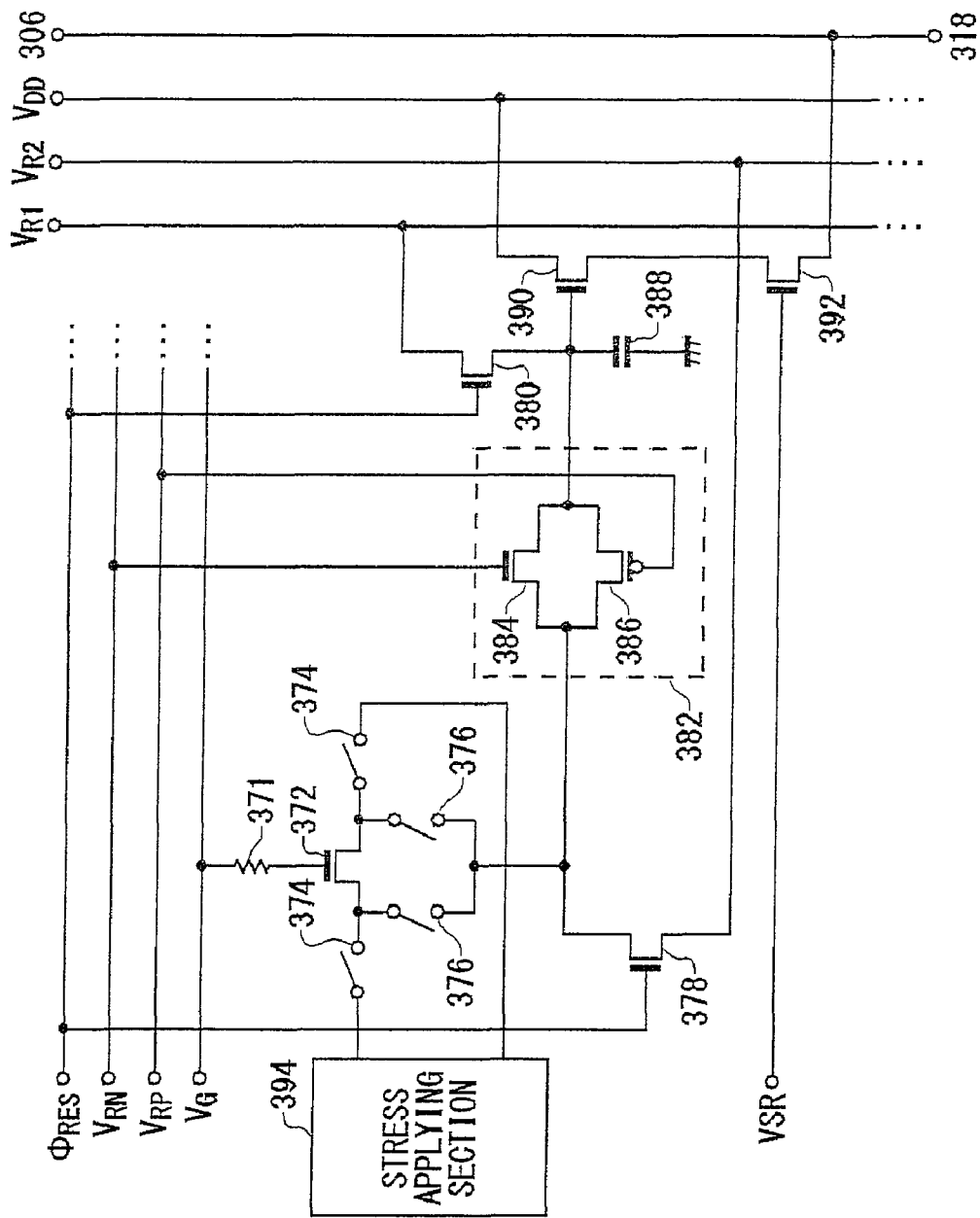
FIG. 11 is a diagram showing another example of the circuit configuration of a cell 310 included in the test circuit 300.

FIG. 11 shows another example of the circuit configuration of each cell 310 included in the test circuit 300. The circuit of the present example charges or discharges a capacitor 388 with a gate leakage current of a transistor under measurement 372 in a state that an electrical stress is applied to the transistor under measurement 372 and a constant electric field is applied to the thin gate insulator of the transistor under measurement 372. The reference property measuring section 140 or the comparison property measuring section 142 calculates the gate leakage current of each transistor under measurement 372, based on any change in the voltage value of the capacitor over a predetermined period.

The circuit configuration of the test circuit 300 of the present example is different from the circuit configuration of the test circuit 300 shown in FIG. 7 in the configuration of each cell 310. FIG. 11 shows the configuration of each cell 310 of the test circuit 300, but not the column selecting section 302, the row selecting section 304, the plurality of column selecting transistors (306-1 and 306-2, hereinafter collectively referred to as 306), the plurality of current sources (318-1 and 318-2, hereinafter collectively referred to as 318), or the output section 320, because they are the same as those shown in FIG. 7.

Each cell 310 includes a stress applying section 394, a transistor under measurement 372, a gate voltage control section 371, a first switch 374, a second switch 376, a voltage applying section 382, a capacitor 388, a row selecting transistor 392, resetting transistors 378 and 380, and an output transistor 390.

The stress applying section 394 applies an electrical stress to the thin gate insulator of the transistor under measurement 372 via the first switch 374. For example, when the transistor under measurement 372 is used as a memory device of a FLASH memory, the stress applying section 394 applies a voltage required for data writing or data erasing to be performed on the transistor under measurement 372.

When the stress applying section 394 is to apply a stress, the stress applying section 394 switches on the first switch 374 to connect both the source terminal and the drain terminal of the transistor under measurement 372 to the stress applying section 394. And the reference property measuring section 140 or the comparison property measuring section 142 switches off the second switch 376. Under such control, the stress applying section 394 can apply a desired voltage to the respective terminals of the transistor under measurement 372 to apply a stress thereto.

In the present example, the stress applying section 394 applies the following four kinds of stresses to the transistor under measurement 314 independently, or sequentially.

(1) FN (Fowler-Nordheim) Gate injection
(2) FN Substrate injection
(3) Hot Electron injection
(4) Source Erase The above items (1) to (4) show methods for applying a stress to the transistor under measurement 372 by writing data onto the transistor under measurement 372 or erasing data from the transistor under measurement 372. Here, the stress applying section 394 may apply to each terminal of the transistor under measurement 372 a voltage that should be applied in order to write data onto the transistor under measurement 372 or erase data from the transistor under measurement 372 in a practical use scene, or may apply to each terminal of the transistor under measurement 372 a voltage larger than the voltage that should be applied in the practical use scene.

Each cell 310 is supplied with a resetting signal $\phi_{RES}$, control voltages $V_{RN}$, $V_{RP}$, $V_{R1}$, $V_{R2}$, and $V_{DD}$, and a gate voltage $V_G$ from the reference property measuring section 140 or the comparison property measuring section 142. The gate voltage control section 371 applies a gate voltage $V_G$ designated by the reference property measuring section 140 or the comparison property measuring section 142 to the gate terminal of the transistor under measurement 372.

The second switch 376 connects or disconnects the source terminal and drain terminal of the transistor under measurement 372 to or from the capacitor 388 via the voltage applying section 382. The voltage applying section 382 applies a constant voltage to the source terminal and drain terminal of the transistor under measurement 372 via the second switch 376. When the second switch 376 is switched on by the reference property measuring section 140 or the comparison property measuring section 142, the voltage generated by the voltage applying section 382 is applied to the source terminal and drain terminal of the transistor under measurement 372. That is, the voltage applying section 382 controls the electric field applied to the thin gate insulator of the transistor under measurement 372 to be substantially constant by applying a constant voltage to the source terminal and drain terminal of the transistor under measurement 372.

The voltage applying section 382 includes an NMOS transistor 384 and a PMOS transistor 386. The NMOS transistor 384 is supplied with a gate voltage $V_{RN}$ corresponding to the voltage to be applied to the source terminal and drain terminal of the transistor under measurement 372, and has its source terminal connected to the source terminal and drain terminal of the transistor under measurement 372 via the second switch 376, and its drain terminal connected to the capacitor 388. The PMOS transistor 386 is provided in parallel connection with the NMOS transistor 384, supplied with a gate voltage $V_{RP}$ corresponding to the voltage to be applied to the source terminal and drain terminal of the transistor under measurement 372, has its drain terminal connected to the source terminal and drain terminal of the transistor under measurement 372 via the second switch 376, and has its source terminal connected to the capacitor 388. The NMOS transistor 384 and the PMOS transistor 386 keep the voltage to be applied across the gate and source or the gate and drain of the transistor under measurement 372 substantially constant, even when a gate leakage current is integrated with the capacitor 388 to cause an electric potential change.

With this configuration, it is possible to apply a constant electric field to the thin gate insulator of the transistor under measurement 372 regardless of whether the transistor under measurement 372 is a P type or an N type, and to charge and discharge the capacitor 388 with the gate leakage current of the transistor under measurement 372.

The capacitor 388 is charged and discharged with the gate leakage current output from the source and the drain terminals of the transistor under measurement 372. That is, the capacitor 388 stores the gate leakage current that flows from the gate terminal to the source terminal and drain terminal, and translates it into a voltage value. The capacitor 388 has its voltage value initialized to a predetermined voltage $V_{R1}$ by the resetting transistors 378 and 380, when they receive the resetting signal $\phi_{RES}$ at their gate terminals.

The output transistor 390 receives the voltage of the capacitor 388 at the gate terminal, and outputs the source voltage corresponding to the received voltage. The row selecting transistor 392 outputs the source voltage of the output transistor 390 to the column selecting transistor 306, upon receiving a selecting signal from the row selecting section 304. With this operation, the output transistor 390 and the row selecting transistor 392 can function as a capacitor voltage output section that may output the capacitor voltage as an output signal at an end on the source and the drain terminals side of the capacitor 388.

Figure 12:
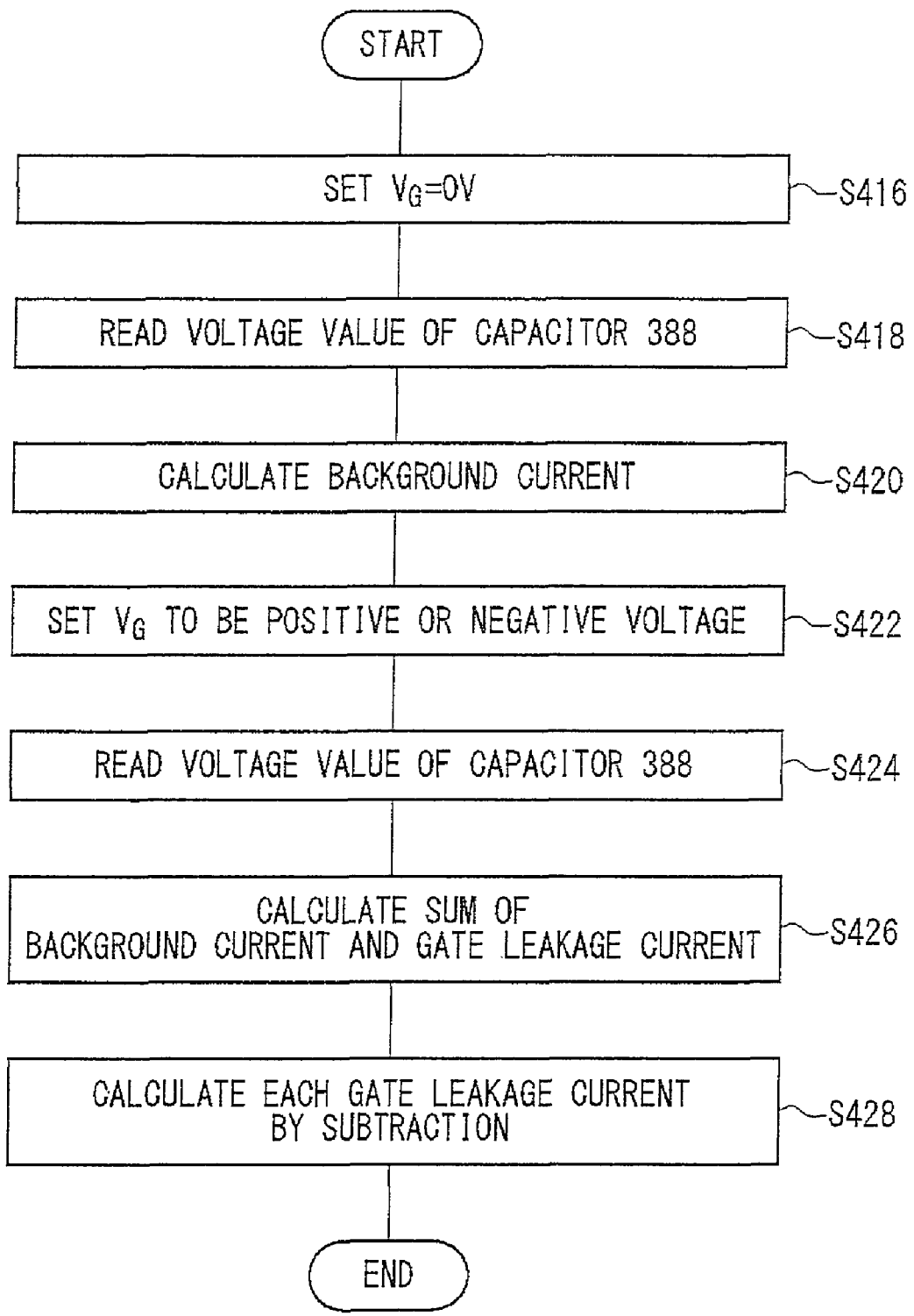
FIG. 12 shows one example of the operation of the reference property measuring section 140 or the comparison property measuring section 142 when it measures the gate leakage current of respective transistors under measurement 372 as a property of the reference device and the comparison device.

FIG. 12 shows one example of the operation of the reference property measuring section 140 or the comparison property measuring section 142, when it measures the gate leakage current of each transistor under measurement 372 as the property of the reference device and the comparison device. Before measuring the gate leakage current of each transistor under measurement 372, the reference property measuring section 140 or the comparison property measuring section 142 first applies an electrical stress to the transistor under measurement 372 of each cell 310.

Here, the reference property measuring section 140 or the comparison property measuring section 142 switches on the first switch 374 and switches off the second switch 376. Then, the reference property measuring section 140 or the comparison property measuring section 142 controls the stress applying section 394 of each cell 310 to apply a stress to the transistor under measurement 372. The reference property measuring section 140 or the comparison property measuring section 142 may control the stresses of (1) to (4) explained with reference to FIG. 10 to be applied independently or sequentially to the transistor under measurement 372. The reference property measuring section 140 or the comparison property measuring section 142 controls the stress to be applied to the transistors under measurement 372 of the respective cells 310 substantially concurrently.

After the above procedures, the reference property measuring section 140 or the comparison property measuring section 142 sequentially selects the transistors under measurement 372 and measures the gate leakage current of the selected transistor under measurement 372, where any transistor under measurement 372 is selected in the same selecting manner as explained with reference to FIGS. 8 and 9, so explanation of the selecting manner will be skipped. In the present example, the operation for measuring the gate leakage current will be explained by taking up one example transistor under measurement 372.

First, the reference property measuring section 140 or the comparison property measuring section 142 switches off the first switch 374 and switches on the second switch 376. Then, the reference property measuring section 140 or the comparison property measuring section 142 applies a gate voltage of substantially 0V to the gate terminal of the transistor under measurement 372 (S416). At this time, no gate leakage current occurs from the transistor under measurement 372.

Next, the reference property measuring section 140 or the comparison property measuring section 142 sets the voltage of the capacitor 388 to be a predetermined initial voltage value. Here, the reference property measuring section 140 or the comparison property measuring section 142 controls the resetting transistor 380 to set the capacitor 388 to be at the initial voltage $V_{R1}$. This setting is made by supplying the resetting transistors 378 and 380 with the resetting signal $\phi_{RES}$ that turns them on.

Next, the reference property measuring section 140 or the comparison property measuring section 142 reads changes in the voltage value of the capacitor 388 that occurs over a predetermined period after the capacitor 388 is set to its initial voltage value (S418). Here, the reference property measuring section 140 or the comparison property measuring section 142 makes the column selecting section 302 and the row selecting section 304 select the cell 310 concerned. The reference property measuring section 140 or the comparison property measuring section 142 receives the voltage output from the output section 320 as the voltage of the capacitor 388.

Next, the reference property measuring section 140 or the comparison property measuring section 142 calculates the current value, i.e., first current value, of the background current of the cell 310, based on the amount of the change in the voltage output from the output section 320 that has been generated over the predetermined period (S420). Here, the capacitor 388 is charged and discharged as the background current because no gate leakage current is generated in the transistor under measurement 372. Hence, the background current can be measured based on the change in the voltage of the capacitor 388 over that predetermined period.

Next, the reference property measuring section 140 or the comparison property measuring section 142 applies a positive or negative gate voltage to the gate terminal of the transistor under measurement 372 (S422). Here, the reference property measuring section 140 or the comparison property measuring section 142 controls the voltages $V_{RN}$ and $V_{RP}$ and keeps the voltage applied across the gate and source or the gate and drain of the transistor under measurement 372 substantially constant. In this case, a gate leakage current corresponding to the gate voltage is generated in the transistor under measurement 372.

Next, the reference property measuring section 140 or the comparison property measuring section 142 sets the voltage of the capacitor 388 to be a predetermined initial voltage value. Then, the reference property measuring section 140 or the comparison property measuring section 142 reads any change in the voltage value of the capacitor 388 that is generated over a predetermined period of the same length as above after the voltage of the capacitor 388 is set to be the initial voltage value (S424).

Next, the reference property measuring section 140 or the comparison property measuring section 142 calculates a second current value, which indicates the sum of the background current and the gate leakage current, based on the variation in the voltage value of the capacitor 388 over the predetermined period (S426). Here, the capacitor 388 is charged and discharged with the current, which is the sum of the background current and the gate leakage current. Thus, the reference property measuring section 140 or the comparison property measuring section 142 can measure the current indicative of the sum of the background current and the gate leakage current, based on the change in the voltage of the capacitor 388 over that predetermined period.

Next, the reference property measuring section 140 or the comparison property measuring section 142 calculates the current value of the gate leakage current, by subtracting the first current value from the calculated second current value (S428).

As described above, the reference property measuring section 140 or the comparison property measuring section 142 can measure the voltage of the capacitor 388 as the electric property of each transistor under measurement 372, by means of the output transistor 390 and the row selecting transistor 392. Hence, by the control described above, it is possible to obtain a precise measurement of the gate leakage current of the transistor under measurement 372, with the influence of the background current eliminated. Further, since the gate leakage current integrated on the capacitor is measured, it is possible to measure the gate leakage current even if it is minute.

Figure 13:
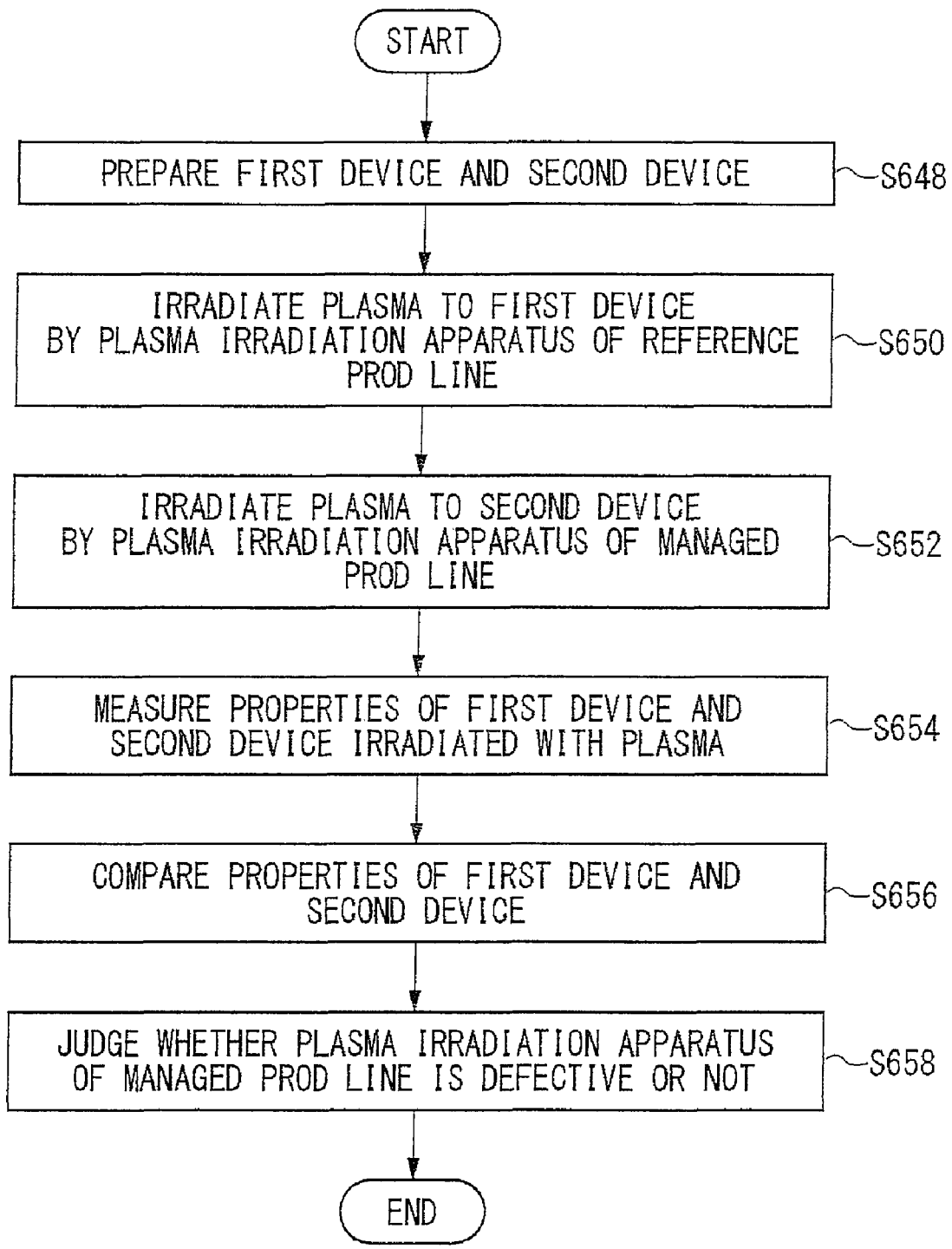
FIG. 13 is a flowchart showing another example of a managing method for managing manufacturing apparatuses 105 used in the respective manufacturing steps of the production line under management 100.

FIG. 13 is a flowchart showing another example of the managing method for managing the manufacturing apparatuses 105 used in the respective manufacturing steps. The managing method of the present example judges whether a plasma irradiation apparatus included in the production line under management 100 is defective or not.

First, a first device and a second device, which are manufactured by the same line, are prepared (S648). The first device and the second device may be manufactured by, for example, the reference production line 200 explained with reference to FIG. 1. Further, the first device and the second device are devices having the same circuit configuration, and may have the test circuit 300 explained with reference to FIG. 7 or 11.

Next, a plasma irradiation apparatus used in the reference production line 200 irradiates plasma to the first device (S650). A plasma irradiation apparatus used in the production line under management 100 irradiates plasma to the second device (S652).

Next, the properties of the first device and second device, to which plasma has been irradiated, are measured (S654). In S654, the properties of the respective devices may be measured with the use of the reference property measuring section 140 and the comparison property measuring section 142, which has been explained above with reference to FIG. 1.

Next, the property of the first device and the property of the second device are compared (S656). Then, based on the difference between the property of the first device and the property of the second device, it is judged whether the plasma irradiation apparatus in the production line under management 100 is defective or not (S658). This judgment may be made in the same manner as that of the judging section 160 explained with reference to FIG. 1. By this method, it is possible to determine the quality of the plasma irradiation apparatus in the production line under management 100.

For example, when the plasma irradiation apparatus caused a plasma damage that is larger than a reference value on an NMOS transistor, the threshold voltage of this transistor drops. Meanwhile, when a pMOS transistor receives a plasma damage larger than a reference value, or in a like case, its threshold voltage increases. The judging section 160 may judge whether the plasma irradiation apparatus is defective or not, based on the difference between the threshold voltages of the transistors under measurement included in the first device and the second device.

Although one aspect of the present invention has been described by way of exemplary embodiments, the technical scope of the present invention is not limited to the scope of disclosure of the embodiments described above. It is apparent to those skilled in the art that many changes and substitutions can be made upon the embodiments. It is apparent from the statement of the claims that embodiments including such changes and substitutions can also be included in the technical scope of the present invention.

As clear from the above, according to an embodiment of the present invention, it is possible to manage, precisely and easily, a manufacturing apparatus used in a production line for manufacturing an electronic device.

The invention claimed is:

1. A method for managing a plurality of manufacturing apparatuses used in a managed production line comprising a plurality of manufacturing processes for manufacturing an electronic device, each of the manufacturing apparatuses being used in one or more of the manufacturing processes, the method comprising:
- acquiring a property of a reference device manufactured in a predetermined reference production line comprising the plurality of manufacturing processes;
- performing at least one of the plurality of manufacturing processes in the managed production line, performing the other manufacturing processes in the predetermined reference production line, and manufacturing a comparison device;
- measuring a property of the comparison device;
- comparing the measured properties of the reference device and the comparison device; and
- judging whether a manufacturing apparatus used in the at least one manufacturing process in the managed production line is defective or not, based on a property difference between the reference device and the comparison device.

2. The method according to claim 1, wherein
said acquiring comprises measuring the property of the reference device.

3. The method according to claim 1, further comprising measuring properties of a plurality of manufacturing apparatuses used in the reference production line, and ensuring that the respective manufacturing apparatuses used in the reference production line are not defective.

4. The method according to claim 1, further comprising:
- acquiring information on the plurality of manufacturing apparatuses used in the managed production line; and
- building up the reference production line based on the information on the manufacturing apparatuses.

5. The method according to claim 1, further comprising selecting the reference production line from a plurality of production lines in each of which electronic devices are manufactured through a manufacturing process common among the plurality of production lines.

6. The method according to claim 5, wherein
said selecting comprises:
- measuring a property of the electronic device manufactured by each of the plurality of production lines; and
- selecting the reference production line from the plurality of production lines, based on the properties of the electronic devices.

7. The method according to claim 1, wherein
the reference device and the comparison device
each comprise a test circuit including:
- a plurality of circuits under measurement arranged in a two-dimensional matrix, each of which including a transistor under measurement; and
- a selecting section outputting an output signal of a designated one of the plurality of circuits under measurement to an output signal line provided in common to the plurality of circuits under measurement, said acquiring comprises:
- causing the selecting section of the test circuit of the reference device to sequentially select the plurality of circuits under measurement; and
- measuring an electric property of the transistor under measurement included in each of the plurality of circuits under measurement in the test circuit of the reference device, based on the output signal outputted to the output signal line from each of the circuits under measurement selected, and said measuring a property of the comparison device comprises:
- causing the selecting section of the test circuit of the comparison device to sequentially select the plurality of circuits under measurement; and
- measuring an electric property of the transistor under measurement included in each of the plurality of circuits under measurement in the test circuit of the comparison device, based on the output signal outputted to the output signal line from each of the circuits under measurement selected.

8. The method according to claim 7, wherein
each of the circuits under measurement comprises:
- a gate voltage control section that applies a designated gate voltage to a gate terminal of the transistor under measurement;
- a reference voltage input section that supplies a reference voltage input from outside, to a reference voltage side terminal of the transistor under measurement, which is either a drain terminal or a source terminal of the transistor under measurement; and
- a terminal voltage output section that outputs a terminal voltage of a terminal of the transistor under measurement as the output signal on a condition that a selecting signal is input from outside, the terminal being either the drain terminal or the source terminal that is not the reference voltage side terminal, said selecting section comprises:
- a row selecting section that outputs the selecting signal to circuits under measurement corresponding to a designated row out of the plurality of circuits under measurement arranged in the two-dimensional matrix; and
- a column selecting section that selects a terminal voltage of a circuit under measurement that corresponds to a designated column out of the circuits under measurement that receive the selecting signal so as to make the circuit under measurement whose terminal voltage is selected output the terminal voltage to the output signal line, the test circuit further comprises a plurality of current sources each provided in correspondence with one of columns of the plurality of circuits under measurement, for making a designated source-drain current flow through the circuit under measurement that receives the selecting signal from the row selecting section, and said acquiring and said measuring a property of the comparison device comprise measuring the terminal voltage as the electric property of the transistor under measurement.

9. The method according to claim 8, wherein
said acquiring and said measuring a property of the comparison device comprise measuring a threshold voltage of each transistor under measurement as the electric property, based on the reference voltage and the terminal voltage of the transistor under measurement.

10. The method according to claim 9, wherein
said comparing comprises comparing variation in threshold voltages of the plurality of transistors under measurement included in the reference device with variation in threshold voltages of the plurality of transistors under measurement included in the comparison device.

11. The method according to claim 7, wherein
each of the circuits under measurement comprises:
- a gate voltage control section that applies a designated gate voltage to a gate terminal of the transistor under measurement;
- a voltage applying section that applies a voltage to a source terminal and a drain terminal of the transistor under measurement so as to control a voltage applied to a thin gate insulator of the transistor under measurement to be substantially constant;
a capacitor that stores a gate leakage current that flows from the gate terminal of the transistor under measurement to the source terminal and drain terminal thereof; and
a capacitor voltage output section that outputs, as the output signal, a capacitor voltage at one end of the capacitor that is on a side of the source terminal and drain terminal, on a condition that a selecting signal is input from outside, and
said acquiring and said measuring a property of the comparison device comprises measuring the capacitor voltage as the electric property of the transistor under measurement.

12. The method according to claim 1, wherein
in the reference production line, it is assured that the manufacturing apparatus used in each of the plurality of manufacturing processes is not defective.

13. The method according to claim 1, wherein
the reference production line comprises manufacturing apparatuses identical to those in the managed production line,
said acquiring comprises acquiring a result of measuring the property of the reference device manufactured by the reference production line, and
said performing comprises performing said at least one of the plurality of manufacturing processes by one or more manufacturing apparatuses of the managed production line corresponding to said at least one of the plurality of manufacturing processes, and performing said other manufacturing processes by one or more manufacturing apparatuses of the reference production line corresponding to said other manufacturing processes.

14. A method for manufacturing an electronic device by using the managed production line managed by the method according to claim 1.

15. A system for managing a plurality of manufacturing apparatuses used in a managed production line comprising a plurality of manufacturing processes for manufacturing an electronic device, each of the manufacturing apparatuses being used in one or more of the manufacturing processes, the system comprising:
a reference property measuring section that measures a property of a reference device manufactured in a predetermined reference production line comprising the plurality of manufacturing processes;
a comparison device manufacture control section that performs at least one of the plurality of manufacturing processes in the managed production line, performs the other manufacturing processes in the predetermined reference production line, and manufactures a comparison device;
a comparison property measuring section that measures a property of the comparison device;
a property comparing section that compares the properties of the reference device and the comparison device; and
a judging section that judges whether a manufacturing apparatus used in the at least one manufacturing process in the managed production line is defective or not, based on a property difference between the reference device and the comparison device.

16. The system according to claim 15, wherein
in the reference production line, it is ensured that the manufacturing apparatus used in each of the plurality of manufacturing processes is not defective.

17. The system according to claim 15, wherein
the reference production line comprises manufacturing apparatuses identical to those in the managed production line,
said reference property measuring section acquires a result of measuring the property of the reference device manufactured by the reference production line, and
said comparison device manufacture control section performs said at least one of the plurality of manufacturing processes by one or more manufacturing apparatuses of the managed production line corresponding to said at least one of the plurality of manufacturing processes, and performs said other manufacturing processes by one or more manufacturing apparatuses of the reference production line corresponding to said other manufacturing processes.

18. A method for managing a plurality of manufacturing apparatuses used in a managed production line comprising a plurality of manufacturing processes for manufacturing an electronic device, each of the manufacturing apparatuses being used in one or more of the manufacturing processes, the method comprising:
preparing a first device and a second device, both of which are manufactured by an identical production line;
performing one of the manufacturing processes to the first device by a manufacturing apparatus used in a predetermined reference production line that can perform the plurality of manufacturing processes;
performing said one of the manufacturing processes to the first device by a manufacturing apparatus used in the managed production line;
measuring a property of the first device and a property of the second device;
comparing the property of the first device and the property of the second device; and
judging whether said manufacturing apparatus used in the managed production line is defective or not, based on a difference between the properties.

19. The method according to claim 18, wherein
in the predetermined reference production line, it is ensured that the manufacturing apparatus used in each of the plurality of manufacturing processes is not defective.

20. The method according to claim 18, wherein
the predetermined reference production line is configured to include manufacturing apparatuses identical to those in the managed production line.

21. The method according to claim 18, wherein
said one of the manufacturing processes is selected from the group consisting of cleaning, thermal, irradiating plasma, impurity doping, deposition, lithography, etching, and planarization processes.

22. The method according to claim 21, wherein
said one of the manufacturing processes comprises irradiating plasma to the first or the second device.

* * * * *